United States Patent [19]
Miyakawa et al.

[11] Patent Number: 5,805,510
[45] Date of Patent: Sep. 8, 1998

[54] DATA ERASE MECHANISM FOR NONVOLATILE MEMORY OF BOOT BLOCK TYPE

[75] Inventors: Tadashi Miyakawa; Hidetoshi Saito, both of Yokohama; Masao Kuriyama, Fujisawa; Tadayuki Taura, Zushi, all of Japan

[73] Assignee: Kabushiki Kaisha Toshiba, Kawasaki, Japan

[21] Appl. No.: 953,388

[22] Filed: Oct. 17, 1997

[30] Foreign Application Priority Data

Oct. 18, 1996 [JP] Japan ..................................... 8-276179
Feb. 27, 1997 [JP] Japan ..................................... 9-044010

[51] Int. Cl.$^6$ .................................................. G11C 16/04
[52] U.S. Cl. ................................ 365/185.11; 365/185.22; 365/185.29; 365/236
[58] Field of Search ......................... 365/185.11, 185.22, 365/185.29, 236

[56] References Cited

U.S. PATENT DOCUMENTS 5,297,096   3/1994   Terada et al. ...................... 365/185.11
5,590,074  12/1996   Akaogi et al. ..................... 365/185.29
5,592,415   1/1997   Kato et al. ......................... 365/185.29
5,602,789   2/1997   Endoh et al. ....................... 365/185.22

*Primary Examiner*—Huan Hoang
*Attorney, Agent, or Firm*—Banner & Witcoff, Ltd.

[57] ABSTRACT

The total number of bits of irregular blocks is equal to the number of bits of one equal block. The memory cells of the irregular blocks are sequentially designated using an address counter used to designate the memory cells of equal blocks. An erase operation (including pre program and erase operations) starts from "verify". Only when "verify" is NG, the pre program and erase operations are performed. A means capable of fixing a verify result VERIOK at "1" (verify OK) is arranged to always set VERIOK at "1" for a non-select block of the irregular blocks, thereby preventing execution of the pre program and erase operations for the non-select block of the irregular blocks. Accordingly, in the boot block type, the same address counter is shared by the equal and irregular blocks to reduce the circuit scale.

11 Claims, 13 Drawing Sheets

DATA ERASE MECHANISM FOR NONVOLATILE MEMORY OF BOOT BLOCK TYPE

BACKGROUND OF THE INVENTION

The present invention relates to a data erase mechanism for a nonvolatile memory, having nonuniform erase blocks (the unit of erase), such as a NOR flash EEPROM of a boot block type.

An electrically erasable flash EEPROM has three modes, i.e., program, erase, and read modes as fundamental modes. The program mode is an operation of increasing the threshold of a memory cell to 5.5 V or higher, and the erase mode is an operation of decreasing the threshold of the memory cell to the range of 0.5 to 3.0 V.

In a flash EEPROM having automatic program and erase functions, in the program mode, whether the threshold of a memory cell reaches 5.5 V or higher is checked (verified), and a reprogram operation is automatically performed until the threshold of the memory cell reaches 5.5 V or more; and in the erase mode, whether the threshold of the memory cell falls within the range of 0.5 to 3.0 V is checked (verified), and a predetermined operation is automatically performed until the threshold of the memory cell falls within the range of 0.5 to 3.0 V.

In this flash EEPROM, the memory cell array is generally divided into erase blocks serving as the unit of erase. For example, in a 4-megabit (Mbit) flash EEPROM of a 256 kilobits (kbits)×16·I/O type, the memory cell array (4 Mbits) is equally divided into eight blocks, and each block has 512-kbit memory cells.

The memory cell array is divided into a plurality of erase blocks due to a recent need for a single power supply (the number of external power supplies is decreased to one). To satisfy this need, a high voltage used for a program or erase operation must be generated by a booster circuit in a chip on the basis of an external power supply. However, a single-power-supply product in which a high voltage is generated by the booster circuit within the chip consumes power larger than that of a two-power-supply product (product with two external power supplies).

As for a data erase operation, therefore, the current major stream is a nonvolatile memory of a block erase method in which a memory cell array is divided into a plurality of erase blocks, and "erase" is executed in units of blocks. The nonvolatile memory of the block erase method is effective for a reduction in power consumption because an erase operation is executed for only a select block subjected to "data erase".

The block erase methods include two known methods: a method of simultaneously performing an erase operation for one or more blocks selected from a plurality of erase blocks, and a method of serially accessing a plurality of erase blocks, executing an erase operation when an accessed erase block is a select block, and executing no erase operation when an accessed erase block is a non-select block.

The latter method realizes smaller power consumption than in the former method. The following description is associated with the latter method of serially accessing a plurality of erase blocks and executing an erase operation.

FIG. 1 shows main part of a flash EEPROM having conventional automatic program and erase functions. FIG. 2 shows an example of the arrangement of a block select register in FIG. 1. FIG. 3 shows an example of the layout of a memory cell array, a row decoder, a column decoder, and a column select circuit in FIG. 1.

A memory cell array 11 is constituted by a plurality of blocks, and each block is constituted by, e.g., NOR memory cells.

External addresses A0, A1, . . . , A17 are input to a multiplexer 13 directly or via an address register 12. An address counter 16 generates an internal address. The multiplexer 13 supplies either one of the external and internal addresses to row and column decoders 14 and 15.

Input data is supplied to a data input register 8 and a command register 19 via an input/output buffer 17. Data of the data input register 18 is supplied to a memory cell via a column select circuit 20.

The command register 19 recognizes a command made up of an address and data, and outputs control signals to the address register 12, the multiplexer 13, and the data input register 18 in accordance with the command.

When the command register 19 recognizes an erase command, it outputs a latch signal LATCH to a block select register 26. Upon reception of the latch signal LATCH, the block select register 26 latches a signal indicating the presence/absence of selection (erase) in units of blocks for all the blocks of the memory cell array 11.

The block select register 26 checks whether a block designated by the internal address (block address designating a block) of the address counter 16 is a select block (block subjected to "erase"). If so, the block select register 26 sets a control signal GO at "1", and notifies a control circuit 21 of execution of "erase"; otherwise, the block select register 26 sets the control signal GO at "0", and notifies the control circuit 21 of nonexecution of "erase".

A voltage generator 22 generates various voltages corresponding to operation modes. In each operation mode, a voltage generated by the voltage generator 22 is applied to the control gate and bit line of a memory cell.

A verify circuit 23 checks whether a data program/erase operation for a selected memory cell has reliably been performed, and outputs a control signal VERIOK indicating the result to the control circuit 21.

For example, if the control signal VERIOK is "1", the verify circuit 23 determines "verify OK" to end the data program/erase operation. If the control signal VERIOK is "0", the verify circuit 23 determines "verify NG" to continuously perform the data program/erase operation.

A final address detector 24 outputs a detection signal AEND indicating the presence/absence of detection of the final address of each block in the memory cell array 11, and outputs a detection signal BEND indicating the presence/absence of detection of the final block in the memory cell array 11.

A timer 25 counts the number of data program/erase operations executed for selected memory cells. When the number of data program/erase operations with respect to the selected memory cells reaches a predetermined number, the timer 25 outputs a timeout signal TIME OUT to the control circuit 21.

An automatic erase operation in the flash EEPROM will be explained below with reference to an automatic erase sequence in FIG. 4.

When the command register 19 recognizes an erase command, and checks whether "erase" is executed for each erase block, the control circuit 21 controls the operations of the respective circuits so as to execute an automatic erase sequence like the one shown in FIG. 4.

The command register 19 outputs a control signal to the multiplexer 13 so as to supply the internal address of the address counter 16 to the row and column decoders 4 and 15.

The address register 12 and the timer 25 are reset, a block address BLOCK and a row/column address ADD are set to an initial value "0", and a program/erase count CYCLE is also set to an initial value "0" (step ST1).

It is determined whether a block selected by the block address BLOCK is a select block subjected to an automatic erase operation.

If so, the control signal GO changes to "1", and the control circuit 21 starts a pre program operation. If not so, the control signal GO changes to "0", no pre program operation is performed, and the control circuit 21 determines whether the next block is a select block (step ST2).

The pre program operation is performed by the following procedure.

In the voltage generator 22, the internal power supply of a program verify P.V. is set up (step ST3). Data is read from a memory cell (n memory cells in a flash EEPROM of ×n (n is a natural number of 1 or more)·I/O type) selected by the address ADD (step ST4).

The data of the memory cell selected by the address ADD (to be referred to as a select memory cell hereinafter) is compared with program data "0" (step ST5).

More specifically, a voltage (e.g., 5.5 V) serving as the lower limit of a threshold that allows determination of a program state is used as a boundary value. If the threshold of the select memory cell is larger than the boundary value, the data of the select memory cell is determined to be "0". If the threshold of the select memory cell is smaller than the boundary value, the data of the select memory cell is determined to be "1".

When the data of the select memory cell does not coincide with the program data "0", the program operation is determined to be NG, and the verify circuit 23 outputs the control signal VERIOK ="0".

The control circuit 21 executes a data program operation for the select memory cell (injection of electrons in the floating gate). This data program operation is repeatedly performed until the data of the select memory cell coincides with the program data "0" unless the number of program operations reaches a preset count LIMIT (steps ST6 to ST8).

When the program count CYCLE with respect to the select memory cell reaches the preset count LIMIT, even if the data of the select memory cell does not coincide with the program data, the pre program operation ends (step ST6).

In this case, a signal ERROR indicating occurrence of a program error is set to "1" (step ST9).

If the data of the select memory cell coincides with the program data "0", the program operation for the select memory cell is determined to be OK, and the verify circuit 23 sets the control signal VERIOK to "1".

When the control signal VERIOK becomes "1", the control circuit 21 increments the address ADD by one to perform the same operation for a select memory cell having the next address. At this time, the numerical value CYCLE of the timer 25 is reset to an initial value "0" (steps ST10 to ST12).

When the data of the select memory cell coincides with the program data "0", and the address ADD is the final address in the block, the pre program operation ends (step ST10).

When the pre program operation has reliably been executed, i.e., when the signal ERROR is "0", an erase operation is executed.

The erase operation is executed by the following procedure.

The address ADD of the address counter 16 is set to an initial value "0", and the numerical value (corresponding to the number of erase operations) CYCLE of the timer 25 is set to an initial value "0" (step ST13). In the voltage generator 22, the internal power supply of an erase verify E.V. is set up (step ST14).

Then, data is read from a memory cell (n memory cells in a flash EEPROM of ×n (n is a natural number of 1 or more) ·I/O type) selected by the address ADD (step ST15).

The data of the memory cell selected by the address ADD (to be referred to as a select memory cell hereinafter) is compared with an expected value "1" (step ST16).

More specifically, a voltage (e.g., 3.0 V) serving as the upper limit of a threshold that allows determination of an erase state is used as a boundary value. If the threshold of the select memory cell is larger than the boundary value, the data of the select memory cell is determined to be "0". If the threshold of the select memory cell is smaller than the boundary value, the data of the select memory cell is determined to be "1".

When the data of the select memory cell does not coincide with the expected value "1", "erase" is determined to be NG, and the verify circuit 23 outputs the control signal VERIOK ="0". The control circuit 21 executes "data erase" for all the memory cells in the select block (extraction of electrons from the floating gate) (step ST18).

In this case, "data erase" (erase) is executed for all the memory cells in the select block, which is an operation unique to the flash EEPROM. Accordingly, an erase operation is also executed for a memory cell having undergone "erase" other than the select memory cell.

This erase operation is repeatedly performed until the data of the select memory cell coincides with the expected value "1" unless the number of erase operations reaches the preset count LIMIT (steps ST17 to ST19).

When the erase count CYCLE with respect to the select memory cell reaches the preset count LIMIT, even if the data of the select memory cell does not coincide with the expected value "1", the erase operation ends (step ST17).

In this case, the signal ERROR indicating occurrence of an erase error is set to "1" (step ST9).

If the data of the select memory cell coincides with the expected value "1", "erase" from the select memory cell is determined to be OK, and the verify circuit 23 sets the control signal VERIOK to "1".

When the control signal VERIOK becomes "1", the control circuit 21 increments the address ADD by one to perform the same operation for a select memory cell having the next address. At this time, the numerical value CYCLE of the timer 25 is not reset to an initial value "0" because the erase operation is performed for all the memory cells in the select block (steps ST20 and ST21).

When the data of the select memory cell coincides with the expected value "1", and the address ADD is the final address in the block, the erase operation ends (step ST20).

When the signal ERROR is "0", whether the select block is the final block is checked. If so, the automatic erase operation ends after read setup; otherwise, the above operation is repeatedly performed for the next block (steps ST22 to ST24).

The above description has exemplified "block erase". In "chip erase", all blocks are set in a select state in the above-mentioned automatic erase sequence. The erase operation may include a self-convergence operation of returning an excessively erased memory cell to a normal erase state.

Most conventional products (flash EEPROMs) are of an equal block method in which respective erase blocks have the same number of bits (e.g., 512 kbits). However, many recent products are of a boot block type in which the number of bits of a predetermined erase block is different from that of another erase block.

When an automatic program/erase operation is executed for a flash EEPROM of this boot block type, various problems arise.

TABLE 1

Block address in equal block division (256 kbits × 16)

| Block | A17 | A16 | A15 | A14 | A13 | A12 | A11 | ... | A0 | |  |
|---|---|---|---|---|---|---|---|---|---|---|---|
| BLK0 | 0 | 0 | 0 | X | X | X | X | ... | X | 512K | |
| BLK1 | 0 | 0 | 1 | X | X | X | X | ... | X | 512K | |
| BLK2 | 0 | 1 | 0 | X | X | X | X | ... | X | 512K | |
| BLK3 | 0 | 1 | 1 | X | X | X | X | ... | X | 512K | 4 Mbit |
| BLK4 | 1 | 0 | 0 | X | X | X | X | ... | X | 512K | |
| BLK5 | 1 | 0 | 1 | X | X | X | X | ... | X | 512K | |
| BLK6 | 1 | 1 | 0 | X | X | X | X | ... | X | 512K | |
| BLK7 | 1 | 1 | 1 | X | X | X | X | ... | X | 512K | |

A17 (Block address) A15 A14     (Column address) A10 A9 (Row address) A0

Table 1 shows block addresses in the case employing the equal block method in which all erase blocks have the same number of bits (512 kbits). That is, when the sizes of all the erase blocks are equal, of the addresses A17 to A0, addresses A17 to A15 corresponding to 3 bits are used as a block address.

However, the flash EEPROM of the boot block type cannot use block addresses as shown in Table 1 because it is constituted by a plurality of blocks (nonuniform blocks) having the numbers of bits different from each other. That is, the number of column addresses changes in accordance with the size of a block (e.g., a larger/smaller number of columns). In addition, if the number of blocks increases, the number of block addresses must also be increased.

The flash EEPROM of the boot block type is disadvantageously larger in circuit scale than the flash EEPROM of the equal block type because it requires a boot block address counter and an equal block address counter.

BRIEF SUMMARY OF THE INVENTION

The present invention has been made to solve the above drawbacks, and has as its object to provide a means for executing an automatic erase sequence in a nonvolatile memory of the boot block type.

To achieve the above object, according to the present invention, there is provided a nonvolatile memory comprising a memory cell array of a boot block type constituted by a plurality of equal blocks having the same number of bits, and a plurality of irregular blocks, and an address generator for generating, in an erase operation, a block address signal that designates one of the plurality of equal blocks and the plurality of irregular blocks, and row and column address signals that sequentially designate memory cells in a select block when the block designated by the block address signal is a select block subjected to "erase". The address generator has a block address counter for outputting output signals for deriving the block address signal, row and column address counters for outputting the row and column address signals, and means for outputting the row and column address signals corresponding to N bits, and the block address signal corresponding to M bits when the block designated by the block address signal is one of the plurality of equal blocks, and the select block, and outputting the row and column address signals corresponding to (N−n) bits equivalent to a storage capacity of the block designated by the block address signal, and the block address signal corresponding to (M+n) bits when the block designated by the block address signal is one of the plurality of irregular blocks, and the select block (N and M are natural numbers, n is a value determined by a storage capacity of an irregular block designated by the block address signal, and N>n holds).

When the block designated by the block address signal is a select block subjected to "erase", the row and column address signals are sequentially incremented from an initial value to a final value, and "erase" is executed for all memory cells in the select block.

According to the present invention, there is provided a non-volatile memory comprising a memory cell array of a boot block type in which the memory cell array is divided into a plurality of equal blocks having the same number of bits, and a plurality of irregular blocks having the total number of bits equal to the number of bits of one equal block, an address counter for generating, in an erase operation, internal addresses that sequentially designate memory cells in, of the plurality of equal blocks, a select block subjected to "erase", and sequentially designate memory cells in the plurality of irregular blocks when at least one of the plurality of irregular blocks is a select block subjected to "erase", a verify circuit for reading data of a memory cell designated by the internal address and performing "verify", a control circuit for performing a pre program operation for the memory cell designated by the internal address only when the "verify" is NG, or performing "erase" for all memory cells in the select block including the memory cell designated by the internal address, and means for always setting the "verify" to OK regardless of a result of the "verify" of the verify circuit when the internal addresses sequentially designate the memory cells in the plurality of irregular blocks in the erase operation, and a memory cell designated by the internal address exists in a non-select block not subjected to "erase", and setting the "verify" to OK or NG in accordance with the result of the verify of the verify circuit when the memory cell designated by the internal address exists in the select block subjected to "erase".

When the internal addresses sequentially designate the memory cells in the select block of the plurality of equal blocks in the erase operation, the means sets the "verify" to OK or NG in accordance with the result of the "verify" of the verify circuit.

When all the plurality of irregular blocks are non-select blocks not subjected to erase, the address counter does not generate any internal addresses that sequentially designate the memory cells in the plurality of irregular blocks.

The control circuit repeatedly executes the pre program or erase operation until the "verify" becomes OK unless the number of pre program or erase operations reaches a predetermined number.

When a block address of the internal addresses designates a non-select block of the plurality of equal blocks in the erase operation, no erase operation is performed for the non-select block.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A nonvolatile memory according to the present invention will be described in detail below with reference to the several views of the accompanying drawing.

Figure 5:
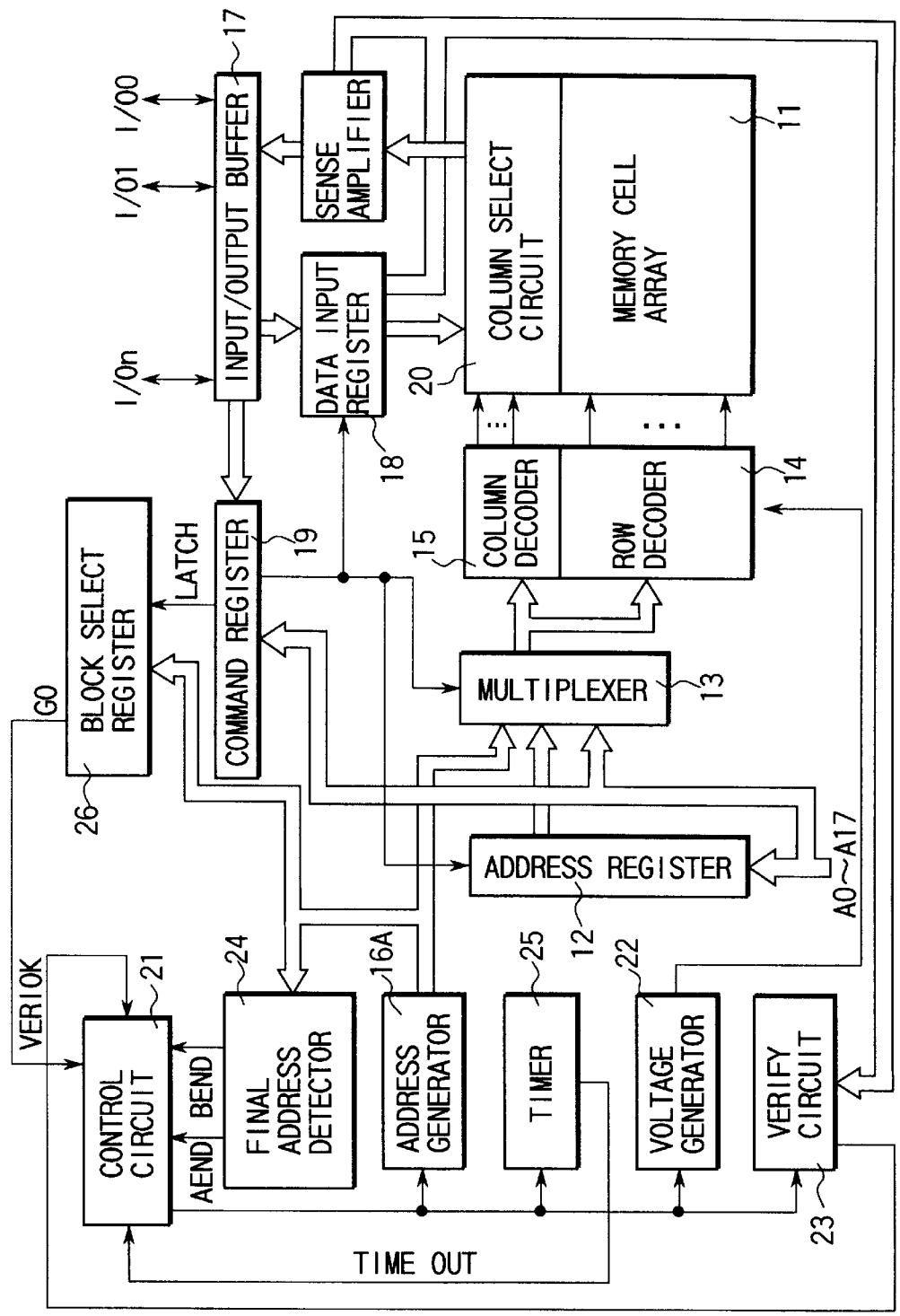
FIG. 5 is a block diagram showing the arrangement of a non-volatile memory according to the first embodiment of the present invention.
Figure 6A:
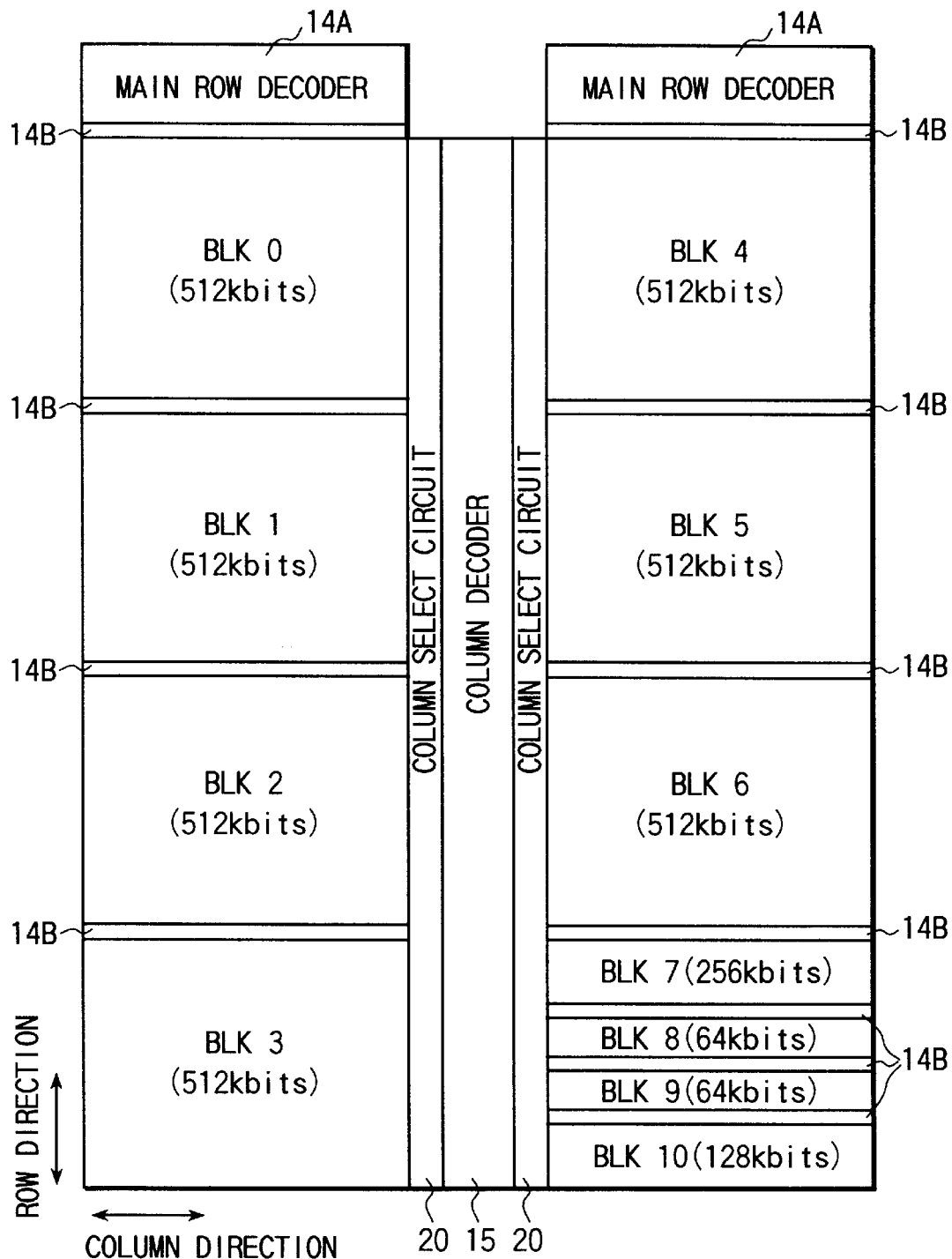
FIG. 6A is a view showing the layout of a memory cell array in FIG. 5.
Figure 6B:
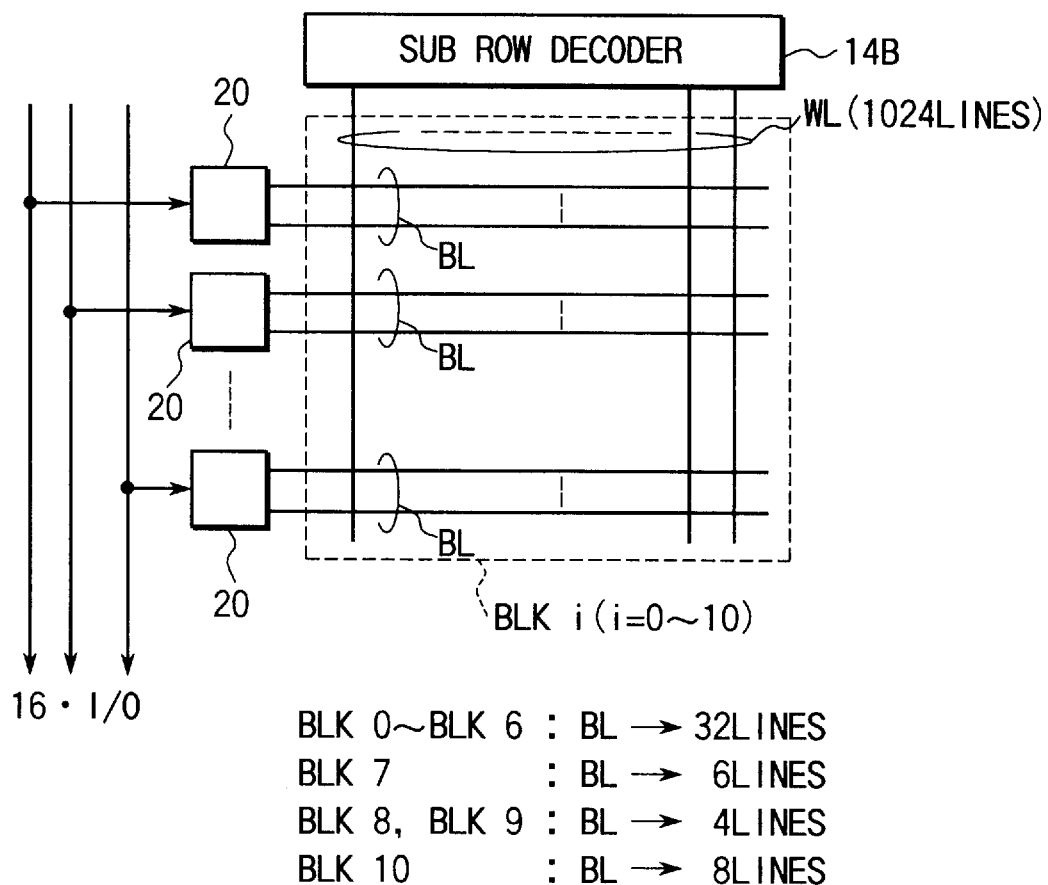
FIG. 6B is a diagram showing the internal arrangement of a block in FIG. 6A.
Figure 7:
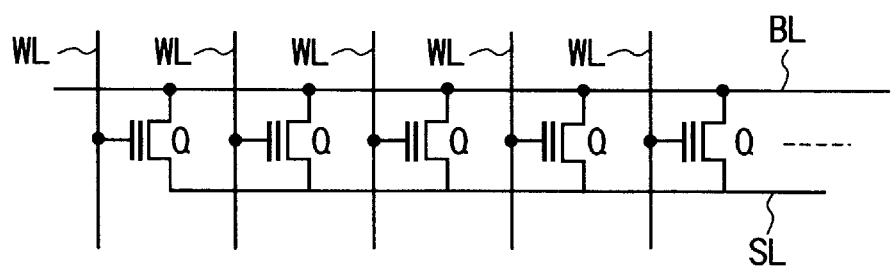
FIG. 7 is a circuit diagram showing part of the memory cell array.

FIG. 5 shows the main part of a flash EEPROM according to the first embodiment of the present invention. FIG. 6A shows an example of the layout of a memory cell array, a row decoder, a column decoder, and a column select circuit in FIG. 5. FIG. 6B shows the internal arrangements of equal and irregular blocks in detail. FIG. 7 shows part of a memory cell array.

A memory cell array 11 is constituted by 11 blocks BLK0 to BLK10, and the blocks BLK0 to BLK10 are constituted by, e.g, NOR memory cells Q, . . . . The control gate of each NOR memory cell Q is connected to a word line WL, its source is connected to a source line SL, and its drain is connected to a bit line BL.

All the seven blocks (equal blocks) BLK0 to BLK6 have the same storage capacity (the number of bits), and the storage capacity is set at, e.g., 512 kbits. The four blocks (irregular blocks) BLK7 to BLK10 have storage capacities different from those of the blocks BLK0 to BLK6. That is, the storage capacity of the block BLK7 is 256 kbits, that of the block BLK8 is 64 kbits, that of the block BLK9 is 64 kbits, and that of the block BLK10 is 128 kbits.

More specifically, exemplifying a 4-Mbit flash EEPROM of a 256 kbits×16 ·I/O type, the number of I/Os (the number of data which can be simultaneously input/output) of each of the blocks (equal blocks) BLK0 to BLK6 is 16, and 32 bit lines BL are connected to one I/O. That is, one bit line BL connected to one I/O can be selected by column addresses ADD14 to ADD10 corresponding to 5 bits. The number of word lines WL of each of the blocks (equal blocks) BLK0 to BLK6 is 1,024. Therefore, one word line WL can be selected by row addresses ADD9 to ADD0 corresponding to 10 bits.

The number of I/Os of the block (irregular block) BLK7 is 16, and 16 bit lines BL are connected to one I/O. That is, one bit line BL connected to one I/O can be selected by column addresses ADD13 to ADD10 corresponding to 4 bits. The number of word lines WL of the block BLK7 is 1,024. Therefore, one word line WL can be selected by row addresses ADD9 to ADD0 corresponding to 10 bits.

The number of I/Os of each of the blocks (irregular blocks) BLK8 and BLK9 is 16, and four bit lines BL are connected to one I/O. That it, one bit line BL connected to one I/O can be selected by column addresses ADD11 and ADD10 corresponding to 2 bits. The number of word lines WL of each of the blocks BLK8 and BLK9 is 1,024. Therefore, one word line WL can be selected by row addresses ADD9 to ADD0 corresponding to 10 bits.

The number of I/Os of the block (irregular block) BLK10 is 16, and eight bit lines BL are connected to one I/O. That is, one bit line BL connected to one I/O can be selected by column addresses ADD12 to ADD10 corresponding to 3 bits. The number of word lines WL of the block BLK10 is 1,024. Therefore, one word line WL can be selected by row addresses ADD9 to ADD0 corresponding to 10 bits.

A total of the storage capacities of the four blocks (irregular blocks) BLK7to BLK10 is equal to the storage capacity of one of the blocks (equal blocks) BLK0 to BLK6.

External addresses A0, A1, . . . , A17 are input to a multiplexer 13 directly or via an address register 12. An address generator 16A generates an internal address. The multiplexer 13 supplies either one of the external and internal addresses to row and column decoders 14 and 15.

Input data is supplied to a data input register 18 and a command register 19 via an input/output buffer 17. Data of the data input register 18 is supplied to a memory cell via a column select circuit 20.

The command register 19 recognizes a command made up of an address and data, and outputs control signals to the address register 12, the multiplexer 13, and the data input register 18 in accordance with the command.

When the command register 19 recognizes an erase command, it outputs a latch signal LATCH to a block select register 26. Upon reception of the latch signal LATCH, the block select register 26 latches a signal indicating the presence/absence of selection (erase) in units of blocks for all the blocks of the memory cell array 11.

The block select register 26 checks whether a block designated by the internal address (block address designating a block) of the address generator 16A is a select block (block subjected to "erase"). If so, the block select register 26 sets a control signal GO at "1", and notifies a control circuit 21 of execution of "erase"; otherwise, the block select register 26 sets the control signal GO at "0", and notifies the control circuit 21 of nonexecution of "erase".

A voltage generator 22 generates various voltages corresponding to operation modes. In each operation mode, a voltage generated by the voltage generator 22 is applied to the control gate and bit line BL of a memory cell.

A verify circuit 23 checks whether a data program/erase operation for a selected memory cell has reliably been performed, and outputs a control signal VERIOK indicating the result to the control circuit 21.

For example, if the control signal VERIOK is "1", the verify circuit 23 determines "verify OK" to end the data program/erase operation. If the control signal VERIOK is "0", the verify circuit 23 determines "verify NG" to continuously perform the data program/erase operation.

A final address detector 24 outputs a detection signal AEND indicating the presence/absence of detection of the final address of each block in the memory cell array 11, and outputs a detection signal BEND indicating the presence/absence of detection of the final block in the memory cell array 11.

A timer 25 counts the number of data program/erase operations executed for selected memory cells. When the number of data program/erase operations with respect to the selected memory cells reaches a predetermined number, the timer 25 outputs a timeout signal TIME OUT to the control circuit 21.

Figure 8:
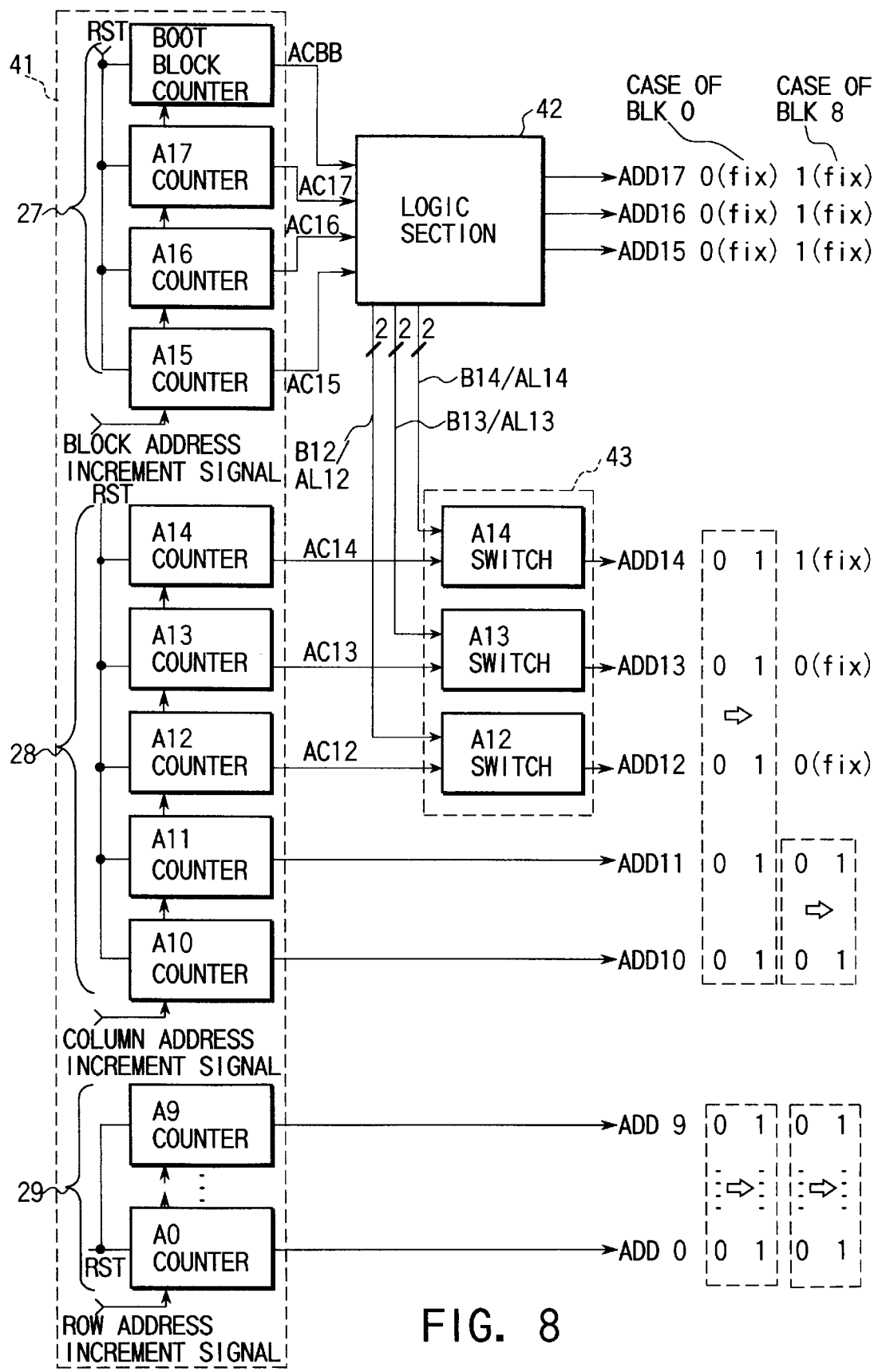
FIG. 8 is a diagram showing the arrangement of an address generator in FIG. 5.
Figure 9:
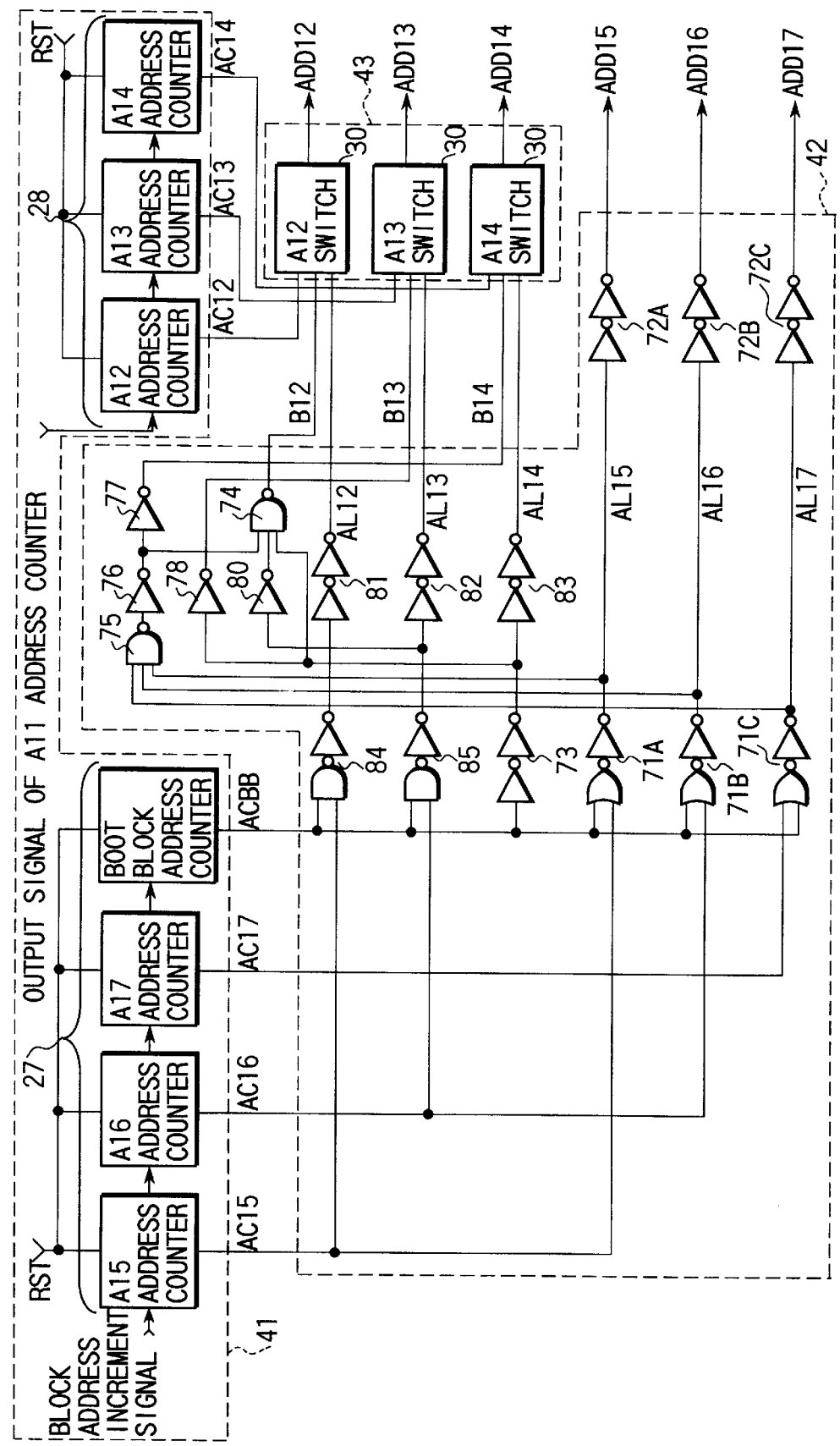
FIG. 9 is a circuit diagram showing the arrangement of the address generator in FIG. 5.

FIG. 8 shows the constituent elements of the address generator 16A in FIG. 5. FIG. 9 is a circuit diagram showing the address generator 16A in FIG. 5 in detail.

The address generator is constituted by an address counter section 41, a logic section 42, and a switch section 43.

The address counter section 41 is constituted by a block address counter 27, a column address counter 28, and a row address counter 29. The block address counter 27 is constituted by four address counter circuits (A17 to A15 counters and a boot block counter) which are serially connected. The block address counter 27 supplies output signals ACBB and AC17 to AC15 for deriving block address signals for selecting a block. The column address counter 28 is constituted by five address counter circuits (A14 to A10 counters) which are serially connected. The column address counter 28 outputs column address signals AC14 to AC10. The row address counter 29 is constituted by 10 address counter circuits (A9 to A0 counters) which are serially connected. The row address counter 29 outputs row address signals ADD9 to ADD0.

The output signals ACBB and AC17 to AC15 from the block address counter 27 are sequentially incremented in response to a block address increment signal. The output signals AC14 to AC10 from the column address counter 28 are sequentially incremented in response to a column address increment signal. The output signals AC9 to AC0 from the row address counter 29 are sequentially incremented in response to a row address increment signal. Each counter of the address counter section 41 receives a reset signal RST.

The logic section 42 receives the output signals ACBB and AC17 to AC15 from the address counter 27. On the basis of the output signals ACBB and AC17 to AC15, the logic section 42 generates block address signals AL17 to AL15 (ADD17 to ADD15) and AL14 to AL12. The block address signals AL17 to AL15 (ADD17 to ADD15) are directly used as block addresses. The block address signals AL14 to AL12 are input to switches 30 of the switch circuit 43 to be or not to be used as block addresses.

Each switch 30 of the switch circuit 43 selects any one of the output signals (column address signals) AC14 to AC12 from the address counter 28 and the block address signals AL14 to AL12. That is, the address signals ADD14 to ADD12 output from the switch circuit 43 are used as column address signals or block address signals.

Figure 10:
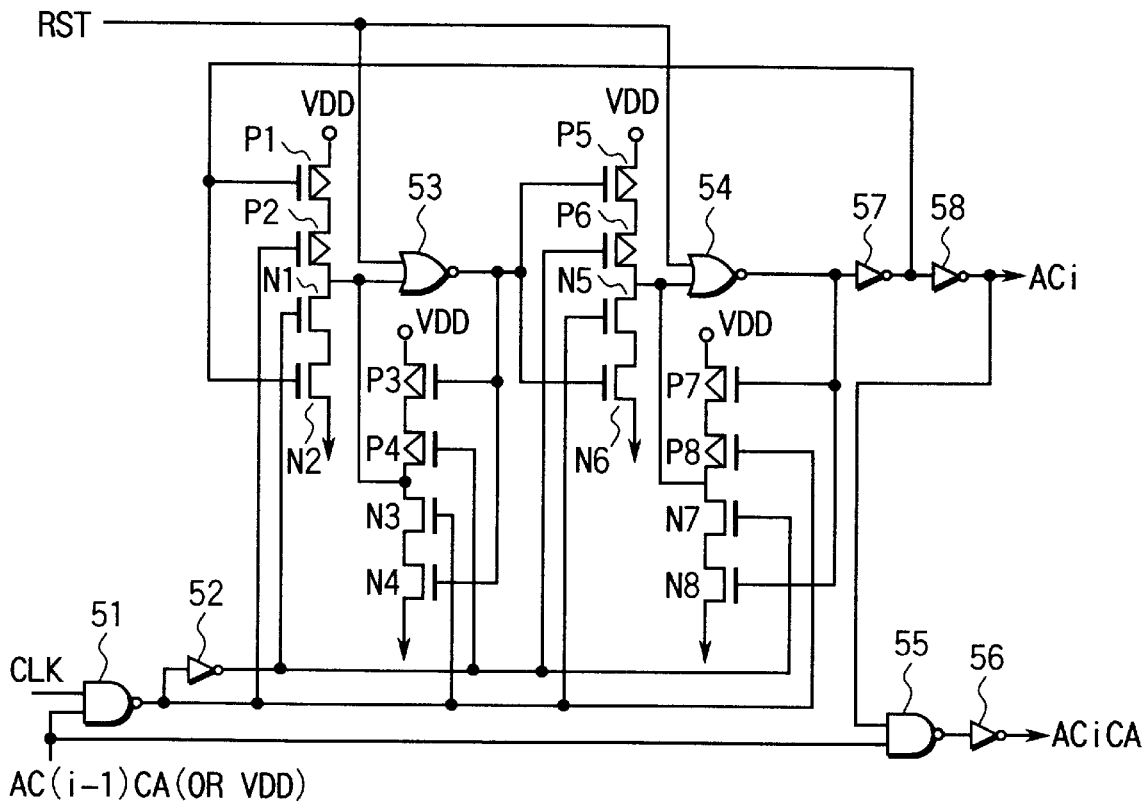
FIG. 10 is a circuit diagram showing a counter in FIGS. 8 and 9.

FIG. 10 shows the arrangements of the address counters 27 to 29 in FIG. 9.

FIG. 10 shows an Ai address counter (i=17, . . . , 0) of the address counter section. A NAND circuit 51 receives a clock signal CLK, and an output signal AC(i-1)CA from an (Ai-1) address counter immediately before the Ai address counter (or power supply potential VDD when the Ai address counter is the first one (i=0)). An output signal from the NAND circuit 51 is input to the gates of transistors P2, N3, N5, and P8, and at the same time to an inverter circuit 52. An output signal from the inverter circuit 52 is input to the gates of transistors N1, P4, P6, and N7.

Transistors P1, P2, N1, and N2 are serially connected between the power supply terminal and the ground point. Similarly, transistors P3, P4, N3, and N4 are also serially connected between the power supply terminal and the ground point. The reset signal RST, an output signal obtained from the drains of the transistors P2 and N1, and an output signal obtained from the drains of the transistors P4 and N3 are input to a NOR circuit 53. An output signal from the NOR circuit 53 is input to the gates of transistors P3, N4, P5, and N6.

The transistors P5, P6, N5, and N6 are serially connected between the power supply terminal and the ground point. Similarly, the transistors P7, P8, N7, and N8 are also serially connected between the power supply terminal and the ground point. The reset signal RST, an output signal obtained from the drains of the transistors P6 and N5, and an output signal obtained from the drains of the transistors P8 and N7 are input to a NOR circuit 54. An output signal from the NOR circuit 54 is input to the gates of the transistors P7 and N8, and at the same time to an inverter circuit 57.

An output signal from the inverter circuit 57 is input to the gates of the transistors P1 and N2, and at the same time to an inverter circuit 58. An output signal ACi from the Ai address counter is obtained from the inverter circuit 58. A NAND circuit 55 receives an output signal from the inverter circuit 58, and an output signal AC(i-1)CA from the (Ai-1) address counter immediately before the Ai address counter (power supply potential VDD when the Ai address counter is the first one (i=0)). An output signal from the NAND circuit 55 is input to an inverter circuit 56. An output signal ACiCA from the inverter circuit 56 is supplied to an (Ai+1) address counter immediately after the Ai address counter.

Figure 11:
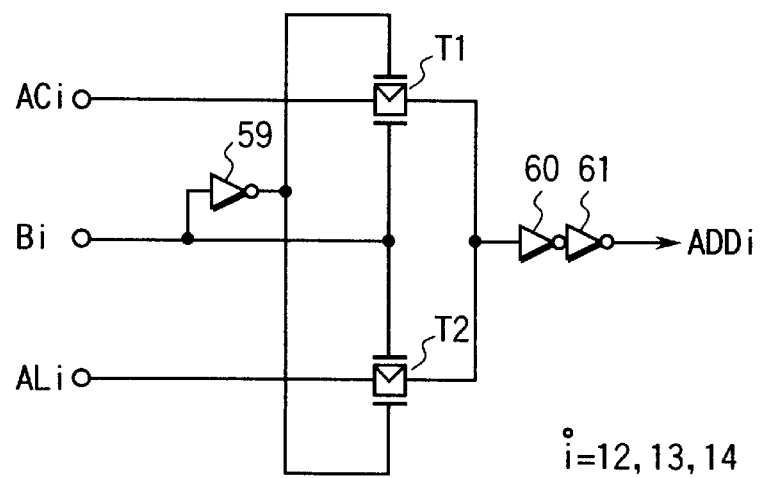
FIG. 11 is a circuit diagram showing a switch in FIGS. 8 and 9.

FIG. 11 shows the arrangement of the switch 30 in FIG. 9.

FIG. 11 shows an Ai switch (i=14, . . . , 12) of the switch section. Transfer gates T1 and T2 receive a control signal Bi. The control signal Bi is generated in the logic section. When the transfer gate T1 is ON, the output signal ACi from the Ai address counter serves as a column address signal ADDi via the transfer gate T1 and inverter circuits 60 and 61. When the transfer gate T2 is ON, a signal ALi generated in the logic section serves as a block address signal ADDi via the transfer gate T2 and the inverter circuits 60 and 61.

The operation of the address generator shown in FIGS. 8 to 11 will be explained below with reference to Tables 2 and 3.

When the block BLK0 is a select block subjected to "erase", the control signal GO in FIG. 5 becomes "1", and an erase operation is performed. More specifically, the row address is sequentially incremented by row address increment signals, while the column address is sequentially incremented by column address increment signals. At this time, the select signals B14, B13, and B12 input to the switches 30 of the switch section 43 are "1,1,1". The switches 30 select the output signals AC14, AC13, and AC12 from the column address counter 28, and output them as the column address signals ADD14, ADD13, and ADD12.

The storage capacity of the block (equal block) BLK0 is 512 kbits, the number of word lines WL is 1,024, and the

TABLE 2

| Block | AC18 (ACBB) | AC17 | AC16 | AC15 | AL17 | AL16 | AL15 | AL14 | AL13 | AL12 | B14 | B13 | B12 |
|---|---|---|---|---|---|---|---|---|---|---|---|---|---|
| BLK0 | 0 | 0 | 0 | 0 | 0 | 0 | 0 | 0 | 0 | 0 | 1 | 1 | 1 |
| BLK1 | 0 | 0 | 0 | 1 | 0 | 0 | 1 | 0 | 0 | 0 | 1 | 1 | 1 |
| BLK2 | 0 | 0 | 1 | 0 | 0 | 1 | 0 | 0 | 0 | 0 | 1 | 1 | 1 |
| BLK3 | 0 | 0 | 1 | 1 | 0 | 1 | 1 | 0 | 0 | 0 | 1 | 1 | 1 |
| BLK4 | 0 | 1 | 0 | 0 | 1 | 0 | 0 | 0 | 0 | 0 | 1 | 1 | 1 |
| BLK5 | 0 | 1 | 0 | 1 | 1 | 0 | 1 | 0 | 0 | 0 | 1 | 1 | 1 |
| BLK6 | 0 | 1 | 1 | 0 | 1 | 1 | 0 | 0 | 0 | 0 | 1 | 1 | 1 |
| BLK7 | 0 | 1 | 1 | 1 | 1 | 1 | 1 | 0 | 0 | 0 | 0 | 1 | 1 |
| BLK8 | 1 | 0 | 0 | 0 | 1 | 1 | 1 | 1 | 0 | 0 | 0 | 0 | 0 |
| BLK9 | 1 | 0 | 0 | 1 | 1 | 1 | 1 | 1 | 0 | 1 | 0 | 0 | 0 |
| BLK10 | 1 | 0 | 1 | 0 | 1 | 1 | 1 | 1 | 1 | 0 | 0 | 0 | 1 |

TABLE 3

Block address in boot block (irregular) division (256 kbits × 16)

| Block | ADD17 | ADD16 | ADD15 | ADD14 | ADD13 | ADD12 | ADD11 | ... | ADD0 | | |
|---|---|---|---|---|---|---|---|---|---|---|---|
| BLK0 | 0 | 0 | 0 | X | X | X | X | ... | X | 512K | |
| BLK1 | 0 | 0 | 1 | X | X | X | X | ... | X | 512K | |
| BLK2 | 0 | 1 | 0 | X | X | X | X | ... | X | 512K | |
| BLK3 | 0 | 1 | 1 | X | X | X | X | ... | X | 512K | |
| BLK4 | 1 | 0 | 0 | X | X | X | X | ... | X | 512K | |
| BLK5 | 1 | 0 | 1 | X | X | X | X | ... | X | 512K | 4 Mbit |
| BLK6 | 1 | 1 | 0 | X | X | X | X | ... | X | 512K | |
| BLK7 | 1 | 1 | 1 | 0 | X | X | X | ... | X | 256K | |
| BLK8 | 1 | 1 | 1 | 1 | 0 | 0 | X | ... | X | 64K | 512 K |
| BLK9 | 1 | 1 | 1 | 1 | 0 | 1 | X | ... | X | 64K | |
| BLK10 | 1 | 1 | 1 | 1 | 1 | X | X | ... | X | 128K | |

A17 ← (Block address) → A12

A14 ← (Column address) → A10

A9 ← (Row address) → A0

An operation performed when the blocks BLK0 to BLK6 are designated, i.e., when the output signals ACBB, AC17, AC16, and AC15 are "0,0,0,0" to "0,1,1,0" will be described.

When the output signals ACBB, AC17, AC16, and AC15 are "0,0,0,0", the block BLK0 of the 4-Mbit flash EEPROM in FIGS. 5 and 6 is designated.

When the block BLK0 is a non-select block not subjected to "erase", the control signal GO in FIG. 5 becomes "0", and no erase operation is performed. Accordingly, the block address is incremented by one by a block address increment signal (output signals ACBB, AC17, AC16, and AC15 are changed to "0,0,0,1").

number of bit lines BL connected to one I/O is 32. The address signals ADD9 to ADD0 corresponding to 10 bits are used as row address signals, and the address signals ADD14 to ADD10 corresponding to 5 bits are used as column address signals.

When all the row address signals ADD9 to ADD0 and the column address signals ADD14 to ADD10 become "1", the erase operation has been executed for all the memory cells of the block BLK0. Thereafter, the values of the column address counter 28 and the row address counter 29 are reset (to "0") by the reset signal RST.

When the output signals ACBB, AC17, AC16, and AC15 are "0,0,0,1" to "0,1,1,0" (when the blocks BLK1 to BLK6 are designated), the above-described operation is repeatedly executed.

When the output signals ACBB, AC17, AC16, and AC15 are "0,1,1,1", the block BLK7 of the 4-Mbit flash EEPROM in FIGS. 5 and 6 is designated.

When the block BLK7 is a non-selected block not subjected to "erase", the control signal GO in FIG. 5 becomes "0", and no erase operation is performed. Therefore, the block address is incremented by one by a block address increment signal (output signals ACBB, AC17, AC16, and AC15 are changed to "1,0,0,0").

When the block BLK7 is a select block subjected to "erase", the control signal GO in FIG. 5 becomes "1", and an erase operation is performed. More specifically, the row address is sequentially incremented by row address increment signals, while the column address is sequentially incremented by column address increment signals. At this time, since all input signals to a NAND circuit 75 are at level "1", the potential of a node a is at level "1". Accordingly, the select signal B14 to the A14 switch 30 becomes "0". The A12 switch 30 selects the output signal AL14 from the logic section 42, and outputs it as the block address signal ADD14. The select signals B13 and B12 to the A13 and A12 switches 30 change to "1". The A13 and A12 switches 30 select the output signals AC13 and AC12 from the A13 and A12 address counters, and output them as the column address signals ADD13 and ADD12.

The storage capacity of the block (irregular block) BLK7 is 256 kbits, the number of word lines WL is 1,024, and the number of bit lines BL connected to one I/O is 16. The address signals ADD9 to ADD0 corresponding to 10 bits are used as row address signals, and the address signals ADD13 to ADD10 corresponding to 4 bits are used as column address signals. The address signals ADD17 to ADD14 corresponding to 4 bits are used as block address signals.

When all the row address signals ADD9 to ADD0 and the column address signals ADD13 to ADD10 become "1", the erase operation has been executed for all the memory cells of the block BLK7. Thereafter, the values of the column address counter 28 and the row address counter 29 are reset (to "0") by the reset signal RST.

When the output signals ACBB, AC17, AC16, and AC15 are "1,0,0,0", the block BLK8 of the 4-Mbit flash EEPROM in FIGS. 5 and 6 is designated.

When the block BLK8 is a non-select block not subjected to "erase", the control signal GO in FIG. 5 becomes "0", and no erase operation is performed. The block address is incremented by one by a block address increment signal (output signals ACBB, AC17, AC16, and AC15 are changed to "1,0,0,1").

When the block BLK8 is a select block subjected to "erase", the control signal GO in FIG. 5 becomes "1", and an erase operation is performed. More specifically, the row address is sequentially incremented by row address increment signals, while the column address is sequentially incremented by column address increment signals. At this time, since all input signals to the NAND circuit 75 are at level "1", the potential of the node a is at level "1". Also, all input signals to a NAND circuit 74 are at level "1", and the potential of a node b is at level "0". Accordingly, the select signals B14, B13, and B12 to the A14, A13, and A12 switches 30 become "0". The A14, A13, and A12 switches 30 select the output signals AL14, AL13, and AL12 from the logic section 42, and output them as the block address signals ADD14, ADD13, and ADD12.

The storage capacity of the block (irregular block) BLK8 is 64 kbits, the number of word lines WL is 1,024, and the number of bit lines BL connected to one I/O is 4. The address signals ADD9 to ADD0 corresponding to 10 bits are used as row address signals, and the address signals ADD11 and ADD10 corresponding to 2 bits are used as column address signals. The address signals ADD17 to ADD12 corresponding to 6 bits are used as block address signals.

When all the row address signals ADD9 to ADD0 and the column address signals ADD11 and ADD10 become "1", the erase operation has been executed for all the memory cells of the block BLK8. Thereafter, the values of the column address counter 28 and the row address counter 29 are reset (to "0") by the reset signal RST.

When the output signals ACBB, AC17, AC16, and AC15 are "1,0,0,1"(when the block BLK9 is designated), the same operation as that when the output signals ACBB, AC17, AC16, and AC15 are "1,0,0,0"is performed.

When the output signals ACBB, AC17, AC16, and AC15 are "1,0,1,0", the block BLK10 of the 4-Mbit flash EEPROM in FIGS. 5 and 6 is designated.

When the block BLK10 is a non-select block not subjected to "erase", the control signal GO in FIG. 5 becomes "0", and no erase operation is performed. At this time, since the block BLK10 is the final block, the block erase operation ends.

When the block BLK10 is a select block subjected to "erase", the control signal GO in FIG. 5 becomes "1", and an erase operation is performed. More specifically, the row address is sequentially incremented by row address increment signals, while the column address is sequentially incremented by column address increment signals. At this time, since all input signals to the NAND circuit 75 are at level "1", the potential of the node a is at level "1". Also, an output signal from the NAND circuit 74 is at level "1", and the potential of the node b is at level "0". Accordingly, the select signals B14 and B13 to the A14 and A13 switches 30 become "0". The A14 and A13 switches 30 select the output signals AL14 and AL13 from the logic section 42, and output them as the block address signals ADD14 and ADD13. The select signal B12 to the A12 switch 30 becomes "1". The A12 switch 30 selects the output signal AC12 from the A12 address counter, and outputs it as the column address signal ADD12.

The storage capacity of the block (irregular block) BLK10 is 128 kbits, the number of word lines WL is 1,024, and the number of bit lines BL connected to one I/O is 8. The address signals ADD9 to ADD0 corresponding to 10 bits are used as row address signals, and the address signals ADD12 to ADD10 corresponding to 3 bits are used as column address signals. The address signals ADD17 to ADD13 corresponding to 5 bits are used as block address signals.

When all the row address signals ADD9 to ADD0 and the column address signals ADD12 to ADD10 become "1", the erase operation has been executed for all the memory cells of the block BLK10. Thereafter, the values of the column address counter 28 and the row address counter 29 are reset (to "0") by the reset signal RST.

A non-volatile memory according to the first embodiment of the present invention has the following effects.

In a non-volatile semiconductor memory device having a memory cell array constituted by equal and irregular blocks, the block addresses of all blocks are generated by arranging at least one boot block counter in a block address counter, and inputting an output signal from the block address counter to a logic circuit without using any address counter dedicated to the irregular block.

This logic circuit can generate column and row addresses for the irregular block in accordance with the block size.

Even in a complicated irregular block arrangement, therefore, the block address can be set without increasing the circuit scale. At the same time, column and row addresses which become irregular depending on the block size can also be set.

Figure 12:
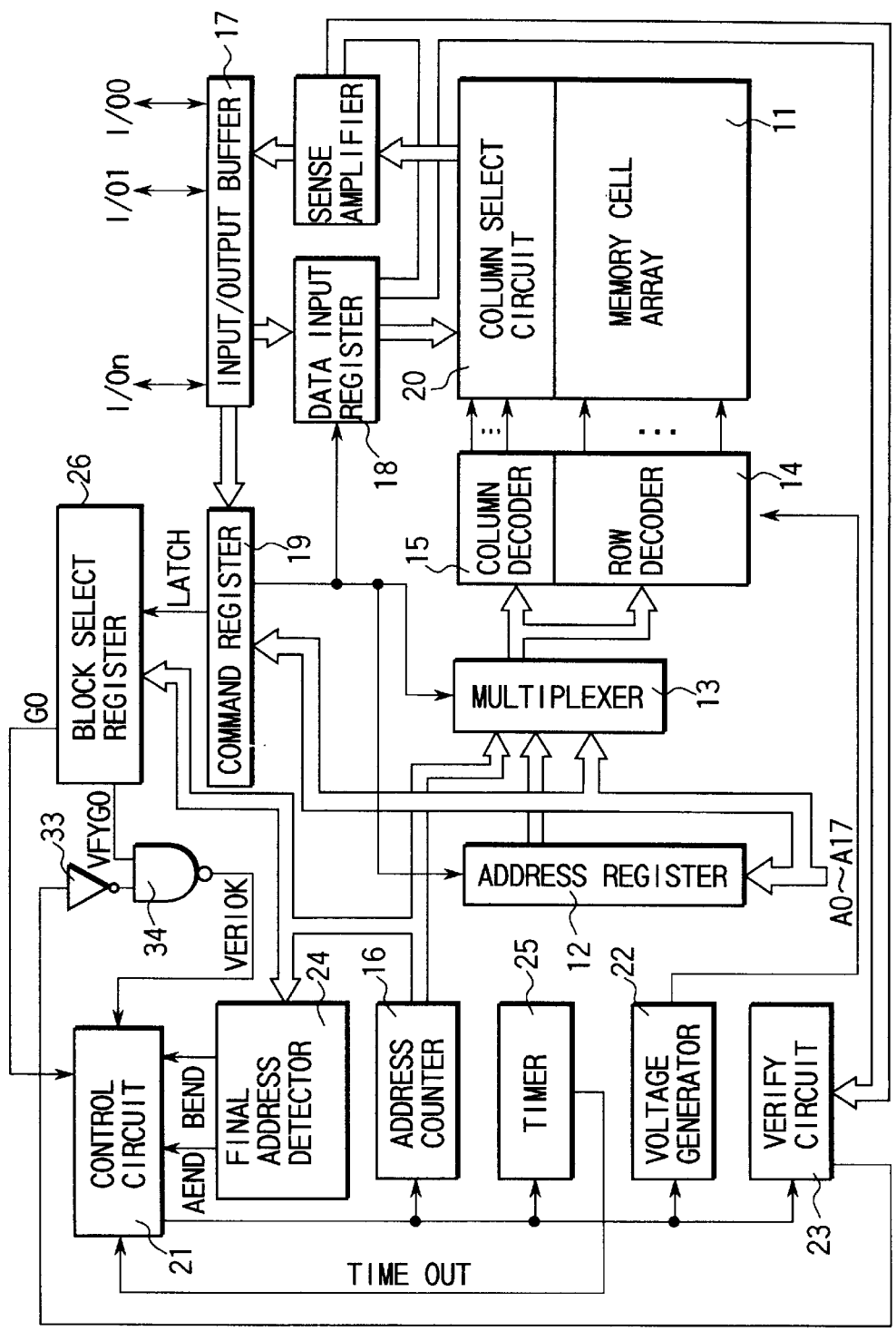
FIG. 12 is a block diagram showing the arrangement of a non-volatile memory according to the second embodiment of the present invention.
Figure 13:
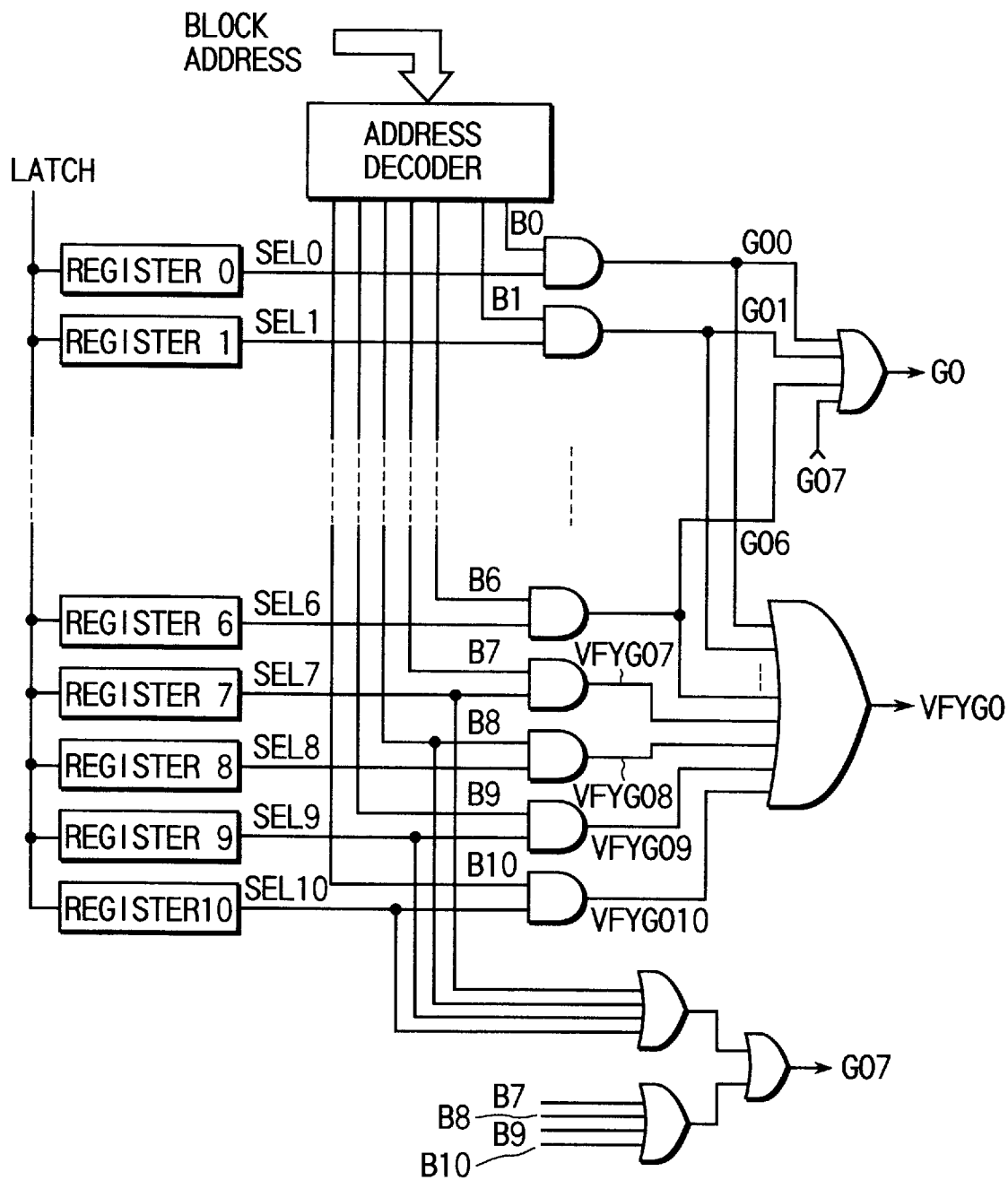
FIG. 13 is a diagram showing a block select register in FIG. 12.
Figure 14:
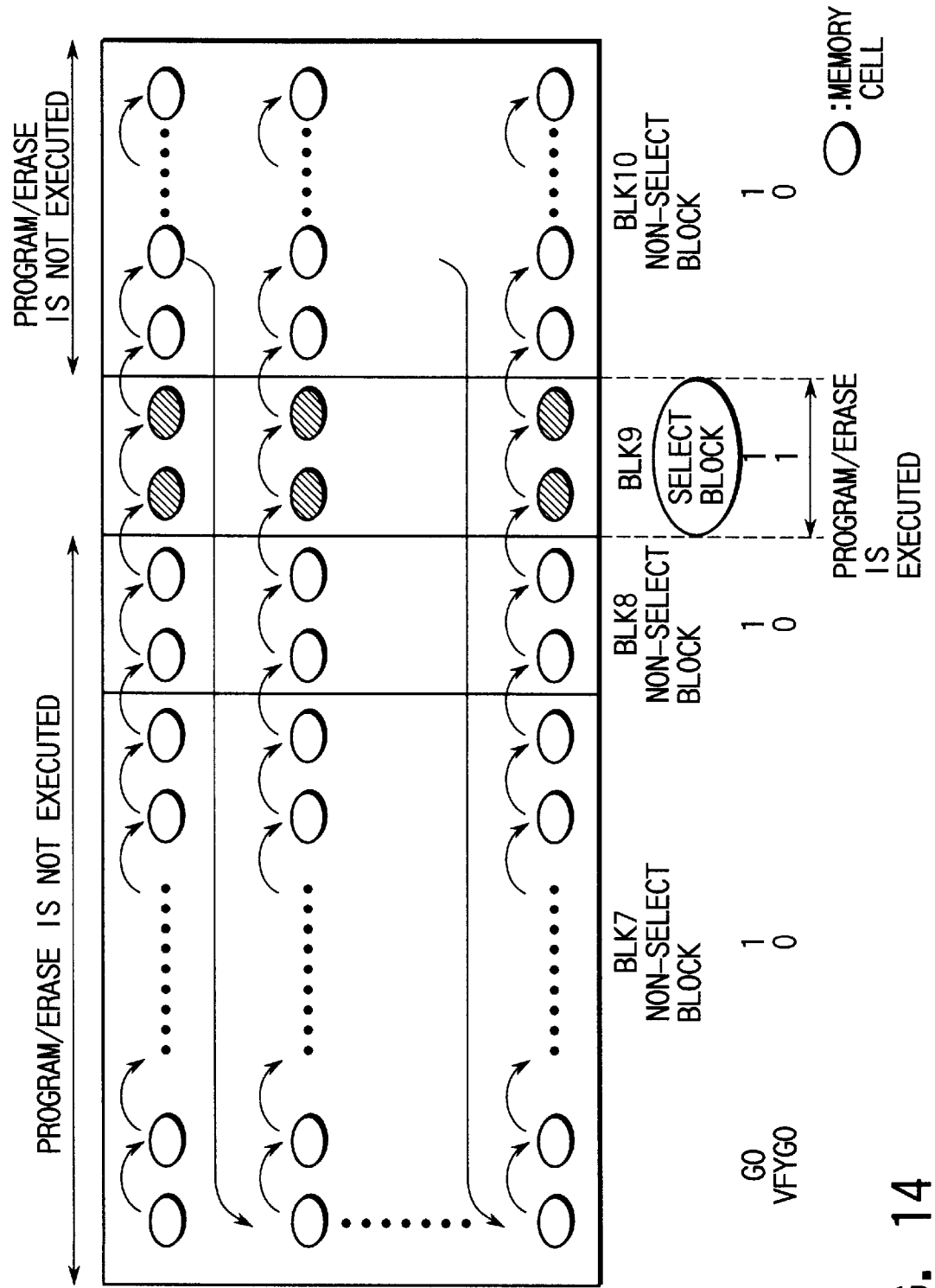
FIG. 14 is a view showing the principle of the second embodiment of the present invention.

FIG. 12 shows main part of a flash EEPROM of the boot block type according to the second embodiment of the present invention. FIG. 13 shows an example of the arrangement of a block select register in FIG. 12.

A memory cell array 11 is constituted by a plurality of erase blocks, and each erase block is constituted by, e.g., NOR memory cells. For example, the memory cell array 11 is constituted by 11 erase blocks. Former seven erase blocks BLK0 to BLK6 have the same number of bits (e.g., 512 kbits). Latter four erase blocks BLK7 to BLK10 respectively have 256 kbits, 64 kbits, 64 kbits, and 128 kbits. The total number of bits of the latter four erase blocks is equal to the number of bits of each of the former seven erase blocks BLK0 to BLK6.

External addresses A0, A1, . . . , A17 are input to a multiplexer 13 directly or via an address register 12. An address counter 16 generates an internal address. The multiplexer 13 supplies either one of the external and internal addresses to row and column decoders 14 and 15.

Input data is supplied to a data input register 18 and a command register 19 via an input/output buffer 17.

Data of the data input register 18 is supplied to a memory cell via a column select circuit 20.

The command register 19 recognizes a command made up of an address and data, and outputs control signals to the address register 12, the multiplexer 13, and the data input register 18 in accordance with the command.

When the command register 19 recognizes an erase command, it outputs a latch signal LATCH to a block select register 32. Upon reception of the latch signal LATCH, registers 0 to 10 latch block select signals SEL0 to SEL10 indicating the presence/absence of selection (erase) of blocks.

More specifically, the register n (n =0, . . . , 10) latches the block select signal ("1" for a select block, or "0" for a non-select block) SELn indicating the presence/absence of selection of the erase block BLKn.

The block select register 32 outputs a control signal GO indicating whether a block is selected, and a control signal VFYGO indicating whether the erase operation (pre program or erase operation) has been complete for a memory cell on the basis of the block select signals SELn latched in any one of registers 0 to 10, and data B0 to B10 prepared by decoding block addresses.

A voltage generator 22 generates various voltages corresponding to operation modes. In each operation mode, a voltage generated by the voltage generator 22 is applied to the control gate and bit line of a memory cell.

A verify circuit 23 checks whether a data program/erase operation for a selected memory cell has reliably been performed, and outputs a control signal VERIOK indicating the result.

For example, if the control signal VERIOK is "1", the verify circuit 23 determines "verify OK" to end the data program/erase operation. If the control signal VERIOK is "0", the verify circuit 23 determines "verify NG" to continuously perform the data program/erase operation.

The control signal VERIOK is input to a NAND circuit 34 via an inverter 33. The control signal VFYGO is also input to the NAND circuit 34. The NAND circuit 34 outputs the control signal VERIOK. A control circuit 21 controls the operations of the respective circuits on the basis of the control signal VERIOK.

A final address detector 24 outputs a detection signal AEND indicating the presence/absence of detection of the final address of each block in the memory cell array 11, and outputs a detection signal BEND indicating the presence/absence of detection of the final block in the memory cell array 11.

A timer 25 counts the number of data program/erase operations executed for selected memory cells. When the number of data program/erase operations with respect to the selected memory cells reaches a predetermined number, the timer 25 outputs a timeout signal TIME OUT to the control circuit 21.

The flash EEPROM of the boot block type is characterized in that the memory cell array is divided into equal blocks and irregular blocks, and the total number of bits of all the irregular blocks is equal to the number of bits of each equal block. Since the respective irregular blocks are summed up into one and treated as one equal block, the same address counter can be used for the equal and irregular blocks.

The address counter is shared by both the equal and irregular blocks. For this reason, when at least one of the irregular blocks is a select block, even if a non-select block exists in the plurality of irregular blocks, the memory cells of all the irregular blocks are in a select state.

The select and non-select blocks of the irregular blocks are distinguished from each other on the basis of the control signal VERIOK indicating "verify OK" or "verify NG". In the present invention, a function capable of forcibly fixing the control signal VERIOK at "1" (verify OK) on the basis of a block address is arranged for an erase operation in the irregular block.

Figure 1:
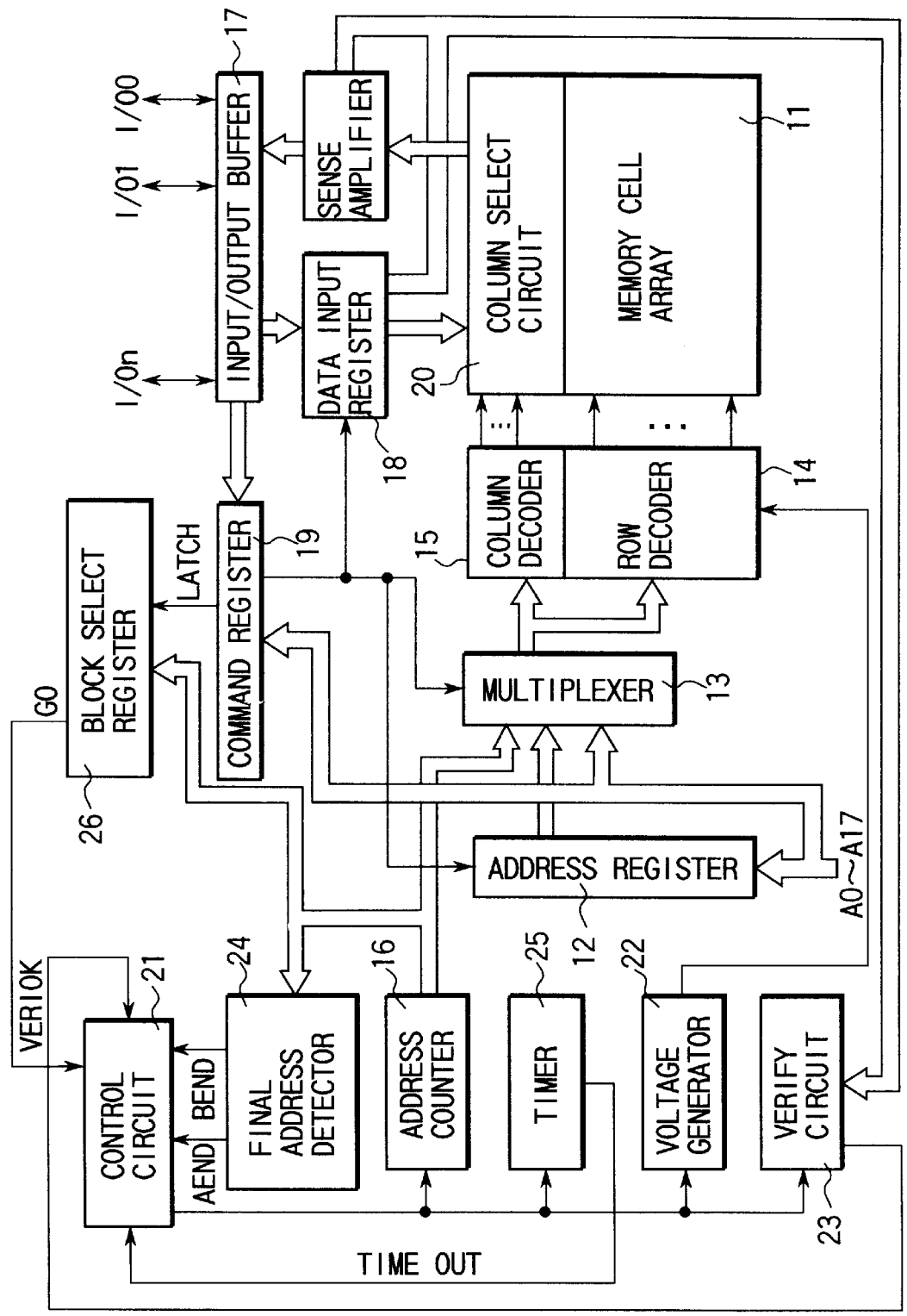
FIG. 1 is a block diagram showing the arrangement of a conventional non-volatile memory.
Figure 2:
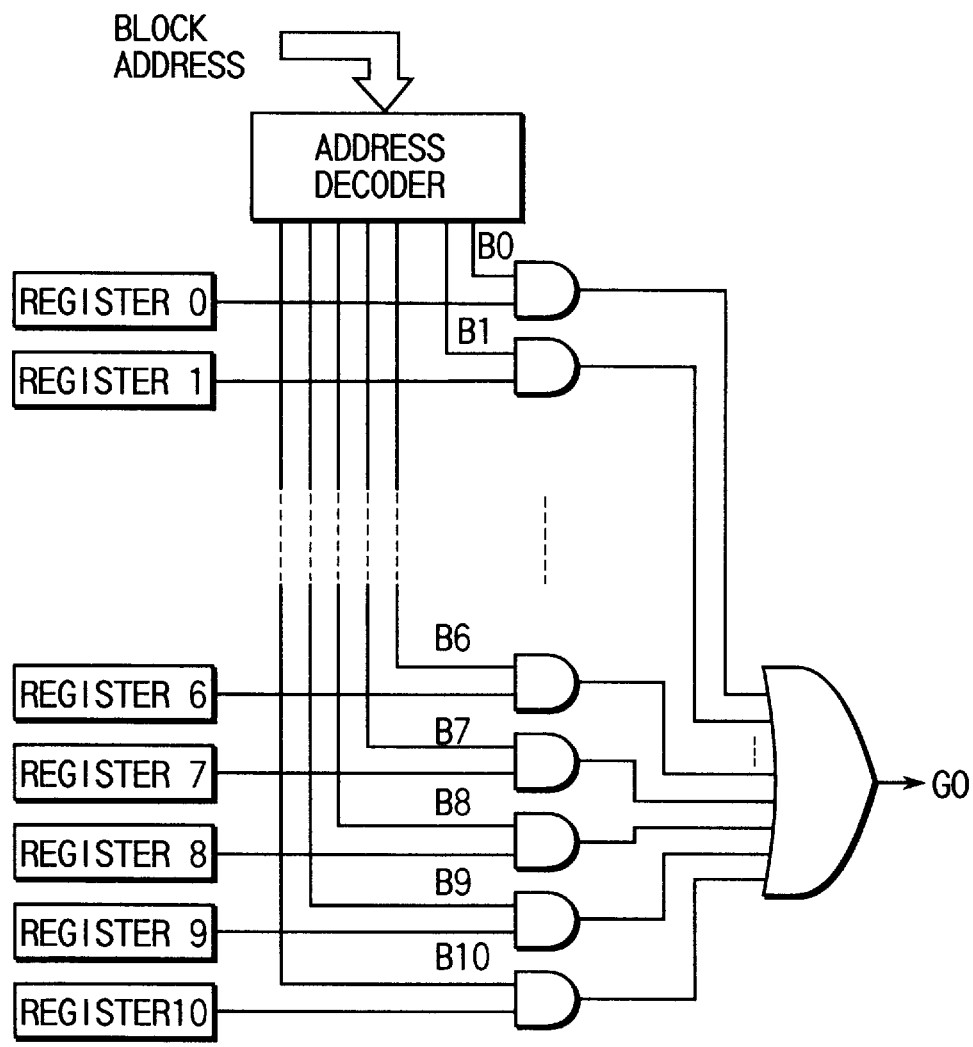
FIG. 2 is a diagram showing a block select register in FIG. 1.
Figure 3:
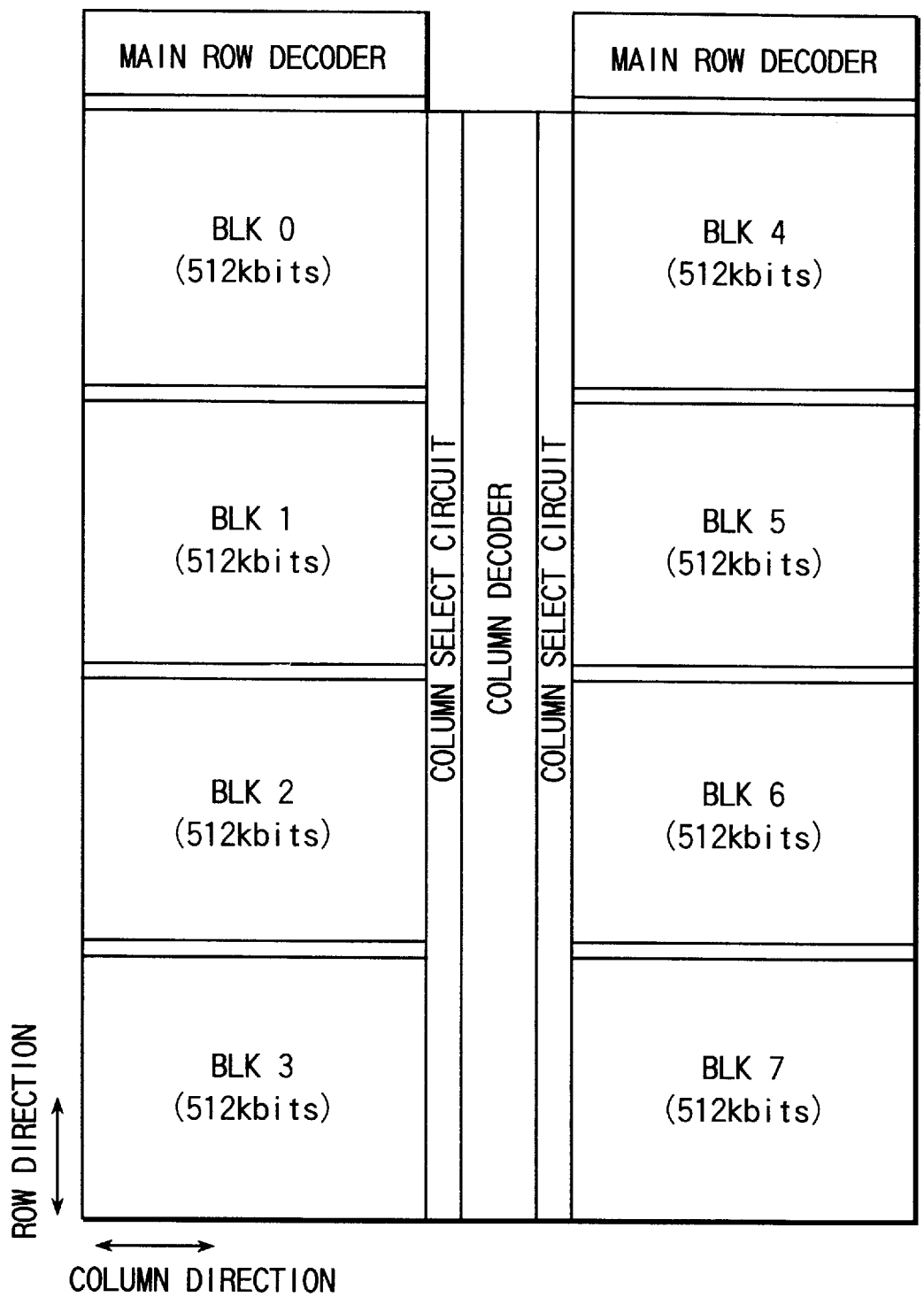
FIG. 3 is a view showing the layout of a memory cell array in FIG. 1.
Figure 4:
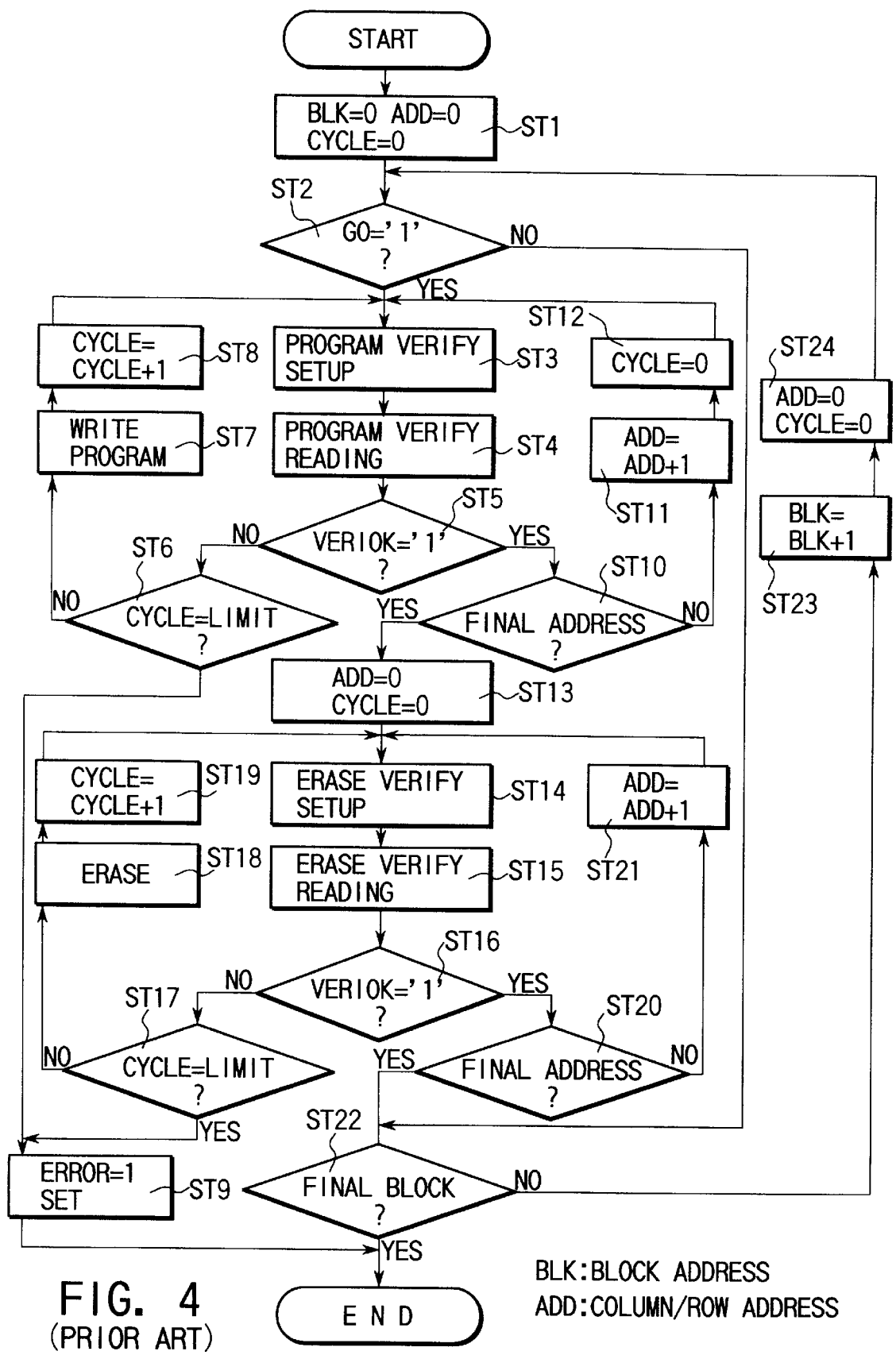
FIG. 4 is a flow chart showing the sequence of an automatic erase operation.

An automatic erase operation in the flash EEPROM will be explained with reference to the logic levels of the control signals VFYGO and GO shown in Table 4. Note that the automatic erase sequence shown in FIG. 4 can be directly used.

TABLE 4

| | Equal block | | | | | | | Irregular block | | | |
|---|---|---|---|---|---|---|---|---|---|---|---|
| Block No. | 0 | 1 | 2 | 3 | 4 | 5 | 6 | 7 | 8 | 9 | 10 |
| SeLi (block select signal) | 0 | 1 | 0 | 0 | 0 | 0 | 0 | 0 | 0 | 1 | 0 |
| VEYGO (whether to fix "verify" OK) | 0 | 1 | 0 | 0 | 0 | 0 | 0 | 0 | 0 | 1 | 0 |
| GO (whether to start erase operation) | 0 | 1 | 0 | 0 | 0 | 0 | 0 | 1 | 1 | 1 | 1 |
| | Erase | | GO = VEYGO | | | | | VERIOK = '1' fix "VERIOK" | VERIOK = '1' fix "VERIOK" | Erase | VERIOK = '1' fix "VERIOK" |

A command made up of an address and data is input, and the command register 19 decodes the command. When the command register 19 detects an erase command, and checks whether "erase" is executed for each erase block, an oscillator is enabled, and the control circuit 21 starts operating.

The command register 19 outputs a control signal to the multiplexer 13 so as to supply the internal address of the address counter 16 to the row and column decoders 14 and 15.

The address register 12 and timer 25 are reset, a block address BLOCK and a row/column address ADD are set to an initial value "0", and a program/erase count CYCLE is also set to an initial value "0"(step ST1).

It is determined whether a block selected by the block address is a select block subjected to an automatic erase operation.

If so, the control signal GO changes to "1", and the control circuit 21 starts the pre program operation. If not so, the control signal GO changes to "0", and the control circuit 21 determines whether the next block is a select block (step ST2).

For example, as shown in Table 4, the case wherein the blocks BLK1 and BLK9 are selected will be examined. When the block address designates the block BLK0, of outputs B0 to B10 from an address decoder in FIG. 13, only the output B0 is "1". However, since the block BLK0 is not selected, and the register 0 latches "0", the control signal GO remains unchanged at "0".

When the block address designates the block BLK1, of the outputs B0 to B10 from the address decoder in FIG. 13, only the output B1 is "1". Since the block BLK1 is selected, and register 1 latches "1", the control signal GO becomes "1".

When the block address designates an equal block, the control signals VFYGO and GO always have the same value.

When the block address designates any one of the equal blocks, the pre program operation is performed by the following procedure.

In the voltage generator 22, the internal power supply of a program verify P.V. is set up (step ST3). Data is read from a memory cell (n memory cells in a flash EEPROM with ×n (n is a natural number of 1 or more) arrangement) selected by the address ADD (step ST4).

The data of the memory cell selected by the address ADD (to be referred to as a select memory cell hereinafter) is compared with program data "0"(step ST5).

More specifically, a voltage (e.g., 5.5 V) serving as the lower limit of a threshold that allows determination of a program state is used as a boundary value. If the threshold of the select memory cell is larger than the boundary value, the data of the select memory cell is determined to be "0". If the threshold of the select memory cell is smaller than the boundary value, the data of the select memory cell is determined to be "1".

When the data of the select memory cell does not coincide with the program data "0", the program operation is determined to be NG, and the verify circuit 23 outputs the control signal VERIOK="0".

The control circuit 21 executes a data program operation for the select memory cell (injection of electrons in the floating gate). This data program operation is repeatedly performed until the data of the select memory cell coincides with the program data "0" unless the number of program operations reaches a preset count LIMIT (steps ST6 to ST8).

When the program count CYCLE with respect to the select memory cell reaches the preset count LIMIT, even if the data of the select memory cell does not coincide with the program data, the pre program operation ends (step ST6).

In this case, a signal ERROR indicating occurrence of a program error is set to "1" (step ST9).

If the data of the select memory cell coincides with the program data "0", the program operation for the select memory cell is determined to be OK, and the verify circuit 23 sets the control signal VERIOK to "1".

When the control signal VERIOK becomes "1", the control circuit 21 increments the address ADD by one to perform the same operation for a select memory cell having the next address. At this time, the numerical value CYCLE of the timer 25 is reset to an initial value "0" (steps ST10 to ST12).

When the data of the select memory cell coincides A with the program data "0", and the address ADD is the final address in the block, the pre program operation ends (step ST10).

When the pre program operation has reliably been executed, i.e., when the signal ERROR is "0", an erase operation is executed.

The erase operation is executed by the following procedure.

The address ADD of the address counter 16 is set to an initial value "0", and the numerical value (corresponding to the number of erase operations) CYCLE of the timer 25 is set to an initial value "0" (step ST13). In the voltage generator 22, the internal power supply of an erase verify E.V. is set up (step ST14).

Then, data is read from a memory cell (n memory cells in a flash EEPROM with ×n (n is a natural number of 1 or more) arrangement) selected by the address ADD (step ST15).

The data of the memory cell selected by the address ADD (to be referred to as a select memory cell hereinafter) is compared with an expected value "1" (step ST16).

More specifically, a voltage (e.g., 3.0 V) serving as the upper limit of a threshold that allows determination of an erase state is used as a boundary value. If the threshold of the select memory cell is larger than the boundary value, the data of the select memory cell is determined to be "0". If the threshold of the select memory cell is smaller than the boundary value, the data of the select memory cell is determined to be "1".

When the data of the select memory cell does not coincide with the expected value "1", "erase" is determined to be NG, and the verify circuit 23 outputs the control signal VERIOK="0". The control circuit 21 executes "data erase" for all the memory cells in the select block (extraction of electrons from the floating gate) (step ST18).

In this case, "data erase" (erase) is executed for all the memory cells in the select block, which is an operation unique to the flash EEPROM. Accordingly, an erase operation is also executed for a memory cell having undergone "erase" other than the select memory cell.

This erase operation is repeatedly performed until the data of the select memory cell coincides with the expected value "1" unless the number of erase operations reaches the preset count LIMIT (steps ST17 to ST19).

When the erase count CYCLE with respect to the select memory cell reaches the preset count LIMIT, even if the data of the select memory cell does not coincide with the expected value "1", the erase operation ends (step ST17).

In this case, the signal ERROR indicating occurrence of an erase error is set to "1" (step ST9).

If the data of the select memory cell coincides with the expected value "1", "erase" from the select memory cell is determined to be OK, and the verify circuit 23 sets the control signal VERIOK to "1".

When the control signal VERIOK becomes "1", the control circuit 21 increments the address ADD by one to perform the same operation for a select memory cell having the next address. At this time, the numerical value CYCLE of the timer 25 is not reset to an initial value "0" because the erase operation is performed for all the memory cells (steps ST20 and ST21).

When the data of the select memory cell coincides with the expected value "1", and the address ADD is the final address in the block, the erase operation ends (step ST20).

The case wherein a block selected by a block address is any one of the irregular blocks BLK7 to BLK10 will be examined.

When at least one of the irregular blocks BLK7 to BLK10 is a select block, all the control signals GO for the irregular blocks BLK7 to BLK10 are "1". For example, as shown in Table 4, when the block BLK9 is selected, the block select signal SEL9 in FIG. 13 is "1". As a result, a signal GO7 becomes "1", and the control signal GO also becomes "1".

When all the irregular blocks BLK7 to BLK10 are non-select blocks, all the control signals GO for the irregular blocks BLK7 to BLK10 are "0".

The control signal VFYGO becomes "1" for only the select block BLK9 of the irregular blocks. When the control signal VFYGO is "1", the control signal VERIOK changes in accordance with an output from the verify circuit 23.

The control signal VFYGO is "0" for the non-select blocks BLK7, BLK8, and the BLK10 of the irregular blocks. When the control signal VFYGO is "0", the control signal VERIOK is always fixed at "1" regardless of an output from the verify circuit 23.

When at least one of the irregular blocks BLK7 to BLK10 is a select block, the control signal GO becomes "1". Therefore, the control circuit 21 starts the pre program operation.

When all the irregular blocks (final blocks) BLK7 to BLK10 are non-select blocks, since the control signal GO becomes "0", the control circuit 21 stops the erase operation (steps ST2 and ST22).

The pre program operation is performed by the following operation.

In the voltage generator 22, the internal power supply of a program verify P.V. is set up (step ST3). Data is read from a memory cell (n memory cells in a flash EEPROM with ×n (n is a natural number of 1 or more) arrangement) selected by the address ADD (step ST4).

The data of the memory cell selected by the address ADD (to be referred to as a select memory cell hereinafter) is compared with program data "0" (step ST5).

More specifically, a voltage (e.g., 5.5 V) serving as the lower limit of a threshold that allows determination of a program state is used as a boundary value. If the threshold of the select memory cell is larger than the boundary value, the data of the select memory cell is determined to be "0". If the threshold of the select memory cell is smaller than the boundary value, the data of the select memory cell is determined to be "1".

When the select memory cell belongs to any one of the non-select blocks BLK7, BLK8, and BLK10, the control signal VFYGO is "0", and the control signal VERIOK is fixed at "1".

Even when, therefore, the data of the select memory cell does not coincide with the program data "0", the control circuit 21 determines "program OK". That is, only "verify" is executed for the select memory cell without performing any program operation.

In this manner, even if the memory cells of the non-select blocks BLK7, BLK8, and BLK10 of the irregular blocks are selected by the address ADD, no program operation is executed because the control signal VERIOK is fixed at "1".

When the select memory cell belongs to the select block BLK9, the control signal VFYGO is "1", and the control signal VERIOK changes in accordance with an output from the verify circuit 23.

When the data of the select memory cell does not coincide with the program data "0", the program operation is determined to be NG, and the verify circuit 23 outputs data "0" to change the control signal VERIOK to "0".

The control circuit 21 executes a data program operation for the select memory cell (injection of electrons in the floating gate). This data program operation is repeatedly performed until the data of the select memory cell coincides with the program data "0" unless the number of program operations reaches a preset count LIMIT (steps ST6 to ST8).

When the program count CYCLE with respect to the select memory cell reaches the preset count LIMIT, even if the data of the select memory cell does not coincide with the program data, the pre program operation ends (step ST6).

In this case, a signal ERROR indicating occurrence of a program error is set to "1" (step ST9).

If the data of the select memory cell coincides with the program data "0", the program operation for the select memory cell is determined to be OK, and the verify circuit 23 outputs data "1" to change the control signal VERIOK to "1".

When the control signal VERIOK becomes "1", the control circuit 21 increments the address ADD by one to perform the same operation for a select memory cell having the next address. At this time, the numerical value CYCLE of the timer 25 is reset to an initial value "0" (steps ST10 to ST12).

When the data of the select memory cell coincides with the program data "0", and the address ADD is the final address in the block, the pre program operation ends (step ST10).

When the signal ERROR is "0" upon completion of the pre program operation, an erase operation is executed.

The erase operation is executed by the following procedure.

The address ADD of the address counter 16 is set to an initial value "0", and the numerical value (corresponding to the number of erase operations) CYCLE of the timer 25 is set to an initial value "0" (step ST13). In the voltage generator 22, the internal power supply of an erase verify E.V. is set up (step ST14).

Then, data is read from a memory cell (n memory cells in a flash EEPROM with ×n (n is a natural number of 1 or more) arrangement) selected by the address ADD (step ST15).

The data of the memory cell selected by the address ADD (to be referred to as a select memory cell hereinafter) is compared with an expected value "1" (step ST16).

More specifically, a voltage (e.g., 3.0 V) serving as the upper limit of a threshold that allows determination of an erase state is used as a boundary value. If the threshold of the select memory cell is larger than the boundary value, the data of the select memory cell is determined to be "0". If the threshold of the select memory cell is smaller than the boundary value, the data of the select memory cell is determined to be "1".

When the select memory cell belongs to any one of the non-select blocks BLK7, BLK8, and BLK10, the control signal VFYGO is "0", and the control signal VERIOK is fixed at "1".

Even when, therefore, the data of the select memory cell does not coincide with the expected value "1", the control circuit 21 determines "erase OK". That is, only "verify" is performed for the block (non-select block) including the select memory cell without performing any "erase".

In this way, even if the memory cells of the non-select blocks BLK7, BLK8, and BLK10 of the irregular blocks are selected by the address ADD, no "erase" is executed because the control signal VERIOK "1" is fixed.

When the select memory cell belongs to the select block BLK9, the control signal VFYGO is "1", and the control signal VERIOK changes in accordance with an output from the verify circuit 23.

When the data of the select memory cell does not coincide with the expected value "1", "erase" is determined to be NG, and the verify circuit 23 outputs data "0" to change the control signal VERIOK to "0". The control circuit 21 executes "data erase" for all the memory cells in the select block (extraction of electrons from the floating gate) (step ST18).

It should be noted that "data erase" (erase) is executed for only the memory cell of the select block BLK9 of the irregular blocks, whereas no "data erase" (erase) is executed for the memory cells of the non-select blocks BLK7, BLK8, and BLK10 of the irregular blocks.

This erase operation is repeatedly performed until the data of the select memory cell coincides with the expected value "1" unless the number of erase operations reaches the preset count LIMIT (steps ST17 to ST19).

When the erase count CYCLE with respect to the select memory cell reaches the preset count LIMIT, even if the data of the select memory cell does not coincide with the expected value "1", the erase operation ends (step ST17).

In this case, the signal ERROR indicating occurrence of an erase error is set to "1" (step ST9).

If the data of the select memory cell coincides with the expected value "1", "erase" from the select memory cell is determined to be OK, and the verify circuit 23 outputs data "1" to change the control signal VERIOK to "1".

When the control signal VERIOK becomes "1", the control circuit 21 increments the address ADD by one to perform the same operation for a select memory cell having the next address. At this time, the numerical value CYCLE of the timer 25 is not reset to an initial value "0" because the erase operation is performed for all the memory cells (steps ST20 and ST21).

When the data of the select memory cell coincides with the expected value "1", and the address ADD is the final address in the block, the erase operation ends (step ST20).

When the signal ERROR is "0", whether the select block is the final block is checked. If so, the automatic erase operation ends after read setup; otherwise, the above operation is repeatedly performed for the next block (steps ST22 to ST24).

The above description has exemplified "block erase". In "chip erase", all blocks are set in a select state in the above-mentioned automatic erase sequence. The erase operation may include a self-convergence operation of returning an excessively erased memory cell to a normal erase state.

With the above-described operation, "verify" is first executed for the irregular block in both the pre program and erase operations.

By always setting "verify OK", i.e., the control signal VERIOK="1" for the non-select blocks BLK7, BLK8, and BLK10 of the irregular blocks, execution of the pre program and erase operations is prevented for the non-select blocks of the irregular blocks.

By setting the value of the control signal VERIOK for the select block BLK9 of the irregular blocks on the basis of an output from the verify circuit, the pre program and erase operations can be executed for the select block of the irregular blocks.

More specifically, the memory cell of the irregular block can be designated using the address counter for the equal block without requiring any address counter dedicated to the irregular block, reducing the circuit scale. The present invention can cope with a flash EEPROM having only equal blocks and a flash EEPROM having both equal and irregular blocks.

As described above, the non-volatile memory according to the second embodiment of the present invention has the following effects.

In a non-volatile semiconductor memory wherein a memory cell array is constituted by a plurality of equal blocks having the same number of bits, and a plurality of irregular blocks having the total number of bits equal to the number of bits of one equal block, the memory cells of all the irregular blocks are sequentially designated using an address counter used to designate the memory cells of the equal blocks.

In this case, if a select block exists in the irregular blocks, the control signal GO indicating whether an erase operation is executed for all the irregular blocks is set to "1" (execution). If no select block exists in the irregular blocks, the control signal GO indicating whether an erase operation is executed for all the irregular blocks is set to "0".

In the automatic erase sequence, "verify" is first performed in both the pre program and erase operations, and then the pre program or erase operation is executed in accordance with the verify result VERIOK.

More specifically, if the verify result VERIOK is "1" (verify OK) for a select memory cell, no pre program or erase operation is performed for the select memory cell. Only when the verify result VERIOK is "0" (verify NG), the pre program or erase operation is performed for the select memory cell.

In the present invention, therefore, no pre program or erase operation is executed for a non-select block of the irregular blocks by always setting "verify OK", i.e., the control signal VERIOK="1" for the non-select block of the irregular blocks.

In addition, the pre program or erase operation can be executed for a select block of the irregular blocks by setting the value of the control signal VERIOK in accordance with an output from the verify circuit.

As has been described above, according to the second embodiment of the present invention, the memory cell of the irregular block can be designated using the address counter for the equal block.

When the plurality of irregular blocks having the total number of bits equal to the number of bits of one equal block, the flash EEPROM of the boot block type is advantageously smaller in circuit scale than the flash EEPROM of the equal block type because if requires the boot block address counter and the logic section.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A non-volatile memory of a boot block type, comprising:
   a memory cell array constituted by a plurality of equal blocks having the same number of bits, and a plurality of irregular blocks; and
   an address generator for generating, in an erase operation, a block address signal that designates one of said plurality of equal blocks and said plurality of irregular blocks, and row and column address signals that sequentially designate memory cells in a select block when said block designated by the block address signal is a select block subjected to "erase",
   said address generator having
      an equal block address counter,
      a boot block address counter,
      row and column address counters for outputting the row and column address signals,
      a logic circuit which receives an output signal from said equal block address counter and an output signal from said boot block address counter,
      a switching circuit for switching between an output signal from said logic circuit and output signals from said row and column address counters, and
      means for generating, in accordance with a selected block, the block address signal, and the row and column address signals that sequentially designate memory cells in said selected block.

2. A memory according to claim 1, wherein said address generator outputting the row and column address signals corresponding to N bits, and the block address signal corresponding to M bits when said block designated by the block address signal is one of said plurality of equal blocks, and said select block, and outputting the row and column address signals corresponding to (N−n) bits equivalent to a storage capacity of said block designated by the block address signal, and the block address signal corresponding to (M+n) bits when said block designated by the block address signal is one of said plurality of irregular blocks, and said select block (N and M are natural numbers, n is a value determined by a storage capacity of an irregular block designated by the block address signal, and N>n holds).

3. A memory according to claim 1, wherein said switching circuit switches between the output signal from said logic circuit and the output signals from said row and column address counters in accordance with a control signal output from said logic circuit.

4. A memory according to claim 1, wherein, when said block designated by the block address signal is a select block subjected to "erase", the row and column address signals are sequentially incremented from an initial value to a final value, and "erase" is executed for all memory cells in said select block.

5. A non-volatile memory of a boot block type, comprising:
   a memory cell array constituted by a plurality of equal blocks having the same number of bits, and a plurality of irregular blocks having the total number of bits equal to the number of bits of one equal block;
   a block address counter for designating said equal blocks;
   an internal address counter for generating internal addresses that designate all memory cells in said equal blocks;
   a verify circuit for reading data of a memory cell designated by the internal address and performing "verify";
   a control circuit for writing and erasing the data of said designated memory cell; and
   means for, in erasing said irregular block, causing said internal address counter to perform the same operation as in erasing said equal block, determining whether said irregular block is a selected block or a non-selected block, and controlling an output signal from said verify circuit to erase only said selected irregular block.

6. A memory according to claim 5, wherein said control circuit performing a pre program operation for said memory cell designated by the internal address only when the "verify" is NG, and performing "erase" for all memory cells in said select block including said memory cell designated by the internal address.

7. A memory according to claim 5, wherein said means always setting the "verify" to OK regardless of a result of the "verify" of said verify circuit when the internal addresses sequentially designate said memory cells in said plurality of irregular blocks in the erase operation, and a memory cell designated by the internal address exists in a non-select block not subjected to "erase", and setting the "verify" to OK or NG in accordance with the result of the "verify" of said verify circuit when said memory cell designated by the internal address exists in said select block subjected to "erase".

8. A memory according to claim 5, wherein, when the internal addresses sequentially designate said memory cells in said select block of said plurality of equal blocks in the erase operation, said means sets the "verify" to OK or NG in accordance with the result of the "verify" of said verify circuit.

9. A memory according to claim 5, wherein, when all said plurality of irregular blocks are non-select blocks not subjected to erase, said address counter does not generate any internal addresses that sequentially designate said memory cells in said plurality of irregular blocks.

10. A memory according to claim 5, wherein said control circuit repeatedly executes the pre program or erase operation until the "verify" becomes OK unless the number of pre program or erase operations reaches a predetermined number.

11. A memory according to claim 5, wherein, when a block address of the internal addresses designates a non-select block of said plurality of equal blocks in the erase operation, no erase operation is performed for said non-select block.

* * * * *

UNITED STATES PATENT AND TRADEMARK OFFICE
CERTIFICATE OF CORRECTION

PATENT NO.: 5,805,510

DATED: September 8, 1998

INVENTOR(S): Miyakawa et al.

It is certified that an error appears in the above-identified patent and that said Letters Patent is hereby corrected as shown below:

Column 3, line 18, delete "xn (n" and insert --x$\underline{n}$ ($\underline{n}$--.
Column 4, line 8, delete "xn (n" and insert --x$\underline{n}$ ($\underline{n}$--.
Column 6, line 8, delete "n" and insert --$\underline{n}$--.
Column 14, line 47, delete "b" and insert --$\underline{b}$--.
Column 17, line 67, delete "(n" and insert --($\underline{n}$-- and delete "xn" and insert --x$\underline{n}$--.
Column 18, line 24, delete "(n" and insert --($\underline{n}$--.
Column 19, line 13, delete "xn (n" and insert --x$\underline{n}$ ($\underline{n}$--.
Column 20, lines 31 and 32, delete "xn (n" and insert --x$\underline{n}$ ($\underline{n}$--.
Column 21, line 38, delete "xn (n" and insert --x$\underline{n}$ ($\underline{n}$--.

Claim 2, column 24, line 31, delete "n" and insert --$\underline{n}$--.

Signed and Sealed this

Eighteenth Day of May, 1999

Attest:

Attesting Officer

Q. TODD DICKINSON

Acting Commissioner of Patents and Trademarks